(12) United States Patent
Lim et al.

(10) Patent No.: US 8,456,601 B2
(45) Date of Patent: Jun. 4, 2013

(54) ARRAY SUBSTRATE FOR LIQUID CRYSTAL DISPLAY DEVICE AND METHOD OF MANUFACTURING THE SAME

(75) Inventors: Joo-Soo Lim, Gyeongsangbuk-do (KR); Hyo-Uk Kim, Gyeongbuk (KR); Hee-Young Kwack, Seoul (KR); Hyun-Seok Hong, Gyeonggi-do (KR); Byung-Chul Ahn, Seoul (KR); Byoung-Ho Lim, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 4 days.

(21) Appl. No.: 13/193,384

(22) Filed: Jul. 28, 2011

(65) Prior Publication Data

US 2011/0281386 A1 Nov. 17, 2011

Related U.S. Application Data

(62) Division of application No. 11/806,214, filed on May 30, 2007, now Pat. No. 8,031,312.

(30) Foreign Application Priority Data

Nov. 28, 2006 (KR) .......................... 10-2006-0118593
Apr. 23, 2007 (KR) .......................... 10-2007-0039312

(51) Int. Cl.
*G02F 1/134363* (2006.01)

(52) U.S. Cl.
USPC .......................................................... 349/141

(58) Field of Classification Search
None
See application file for complete search history.

(56) References Cited

U.S. PATENT DOCUMENTS

| 7,385,661 | B2 | 6/2008 | Chae | |
|---|---|---|---|---|
| 7,480,025 | B2 | 1/2009 | Jeong et al. | |
| 7,528,919 | B2 | 5/2009 | Yoo et al. | |
| 7,705,944 | B2* | 4/2010 | Ahn et al. | 349/138 |
| 7,796,225 | B2 | 9/2010 | Cho et al. | |
| 2002/0036743 | A1* | 3/2002 | Youn et al. | 349/141 |
| 2002/0117691 | A1 | 8/2002 | Choi et al. | |
| 2004/0263757 | A1 | 12/2004 | Kwon | |
| 2005/0077516 | A1* | 4/2005 | Lim et al. | 257/59 |
| 2005/0083466 | A1* | 4/2005 | Lee et al. | 349/141 |
| 2005/0140903 | A1 | 6/2005 | Park et al. | |
| 2006/0139504 | A1* | 6/2006 | Ahn et al. | 349/42 |
| 2007/0216840 | A1 | 9/2007 | Liao et al. | |
| 2008/0002126 | A1 | 1/2008 | Lim et al. | |

FOREIGN PATENT DOCUMENTS

| CN | 1177746 | 4/1998 |
|---|---|---|
| CN | 1595269 | 3/2005 |
| CN | 1614487 | 5/2005 |

(Continued)

*Primary Examiner* — Thanh-Nhan P Nguyen
(74) *Attorney, Agent, or Firm* — Morgan, Lewis & Bockius LLP

(57) ABSTRACT

An array substrate for a liquid crystal display device includes a substrate, a gate line on the substrate, a thin film transistor including a gate electrode of the gate line, a gate insulating layer over the gate electrode, an active layer on the gate insulating layer and ohmic contact layers on the active layer, and source and drain electrodes over the ohmic contact layers, a pixel electrode electrically connected to the drain electrode, a data line electrically connected to the source electrode and crossing the gate line, a common electrode spaced apart from the pixel electrode, and a passivation layer directly between the pixel electrode and the common electrode and directly between the source and drain electrodes.

15 Claims, 48 Drawing Sheets

| | FOREIGN PATENT DOCUMENTS | |
|---|---|---|
| JP | 2004-46203 | 2/2004 |
| JP | 2004-046203 | 2/2004 |
| KR | 1999-52411 | 7/1999 |
| KR | 1020000014701 | 3/2000 |
| KR | 1020040021169 | 3/2004 |
| KR | 1020040108276 | 12/2004 |
| KR | 100471393 | 2/2005 |
| KR | 1020080048379 | 6/2008 |
| TW | 519767 | 2/2003 |
| TW | 200406631 | 5/2004 |

* cited by examiner

ARRAY SUBSTRATE FOR LIQUID CRYSTAL DISPLAY DEVICE AND METHOD OF MANUFACTURING THE SAME

This is a divisional of U.S. application Ser. No. 11/806,214, filed May 30, 2007, now U.S. Pat. No. 8,013,312. This application also claims the benefit of Korean Patent Application Nos. 10-2006-0118593, filed in Korea on Nov. 28, 2006 and 10-2007-0039312, filed in Korea on Apr. 23, 2007, which are hereby incorporated by reference.

BACKGROUND OF THE INVENTION

1. Field of the Invention

Embodiments of the present invention relate to a liquid crystal display device, and more particularly, to an array substrate for a liquid crystal display (LCD) device and a method of manufacturing the same.

2. Discussion Of The Related Art

Liquid crystal display (LCD) devices are driven based on optical anisotropy and polarization characteristics of a liquid crystal material. Liquid crystal molecules have a long and thin shape, and the liquid crystal molecules are regularly arranged along in an alignment direction. Light passes through the LCD device along the long and thin shape of the liquid crystal molecules. The alignment of the liquid crystal molecules depends on the intensity or the direction of an electric field applied to the liquid crystal molecules. By controlling the intensity or the direction of the electric field, the alignment of the liquid crystal molecules changes, and images are displayed. Active matrix liquid crystal display (AMLCD) devices, which include thin film transistors as switching devices for a plurality of pixels, have been widely used due to their high resolution and ability to display fast moving images.

Generally, an LCD device includes two substrates, which are spaced apart and facing each other, and a liquid crystal layer is interposed between the two substrates. Each of the substrates includes an electrode. The electrodes from respective substrates face one another. An electric field is induced between the electrodes by applying a voltage to each electrode. An alignment direction of liquid crystal molecules changes in accordance with a variation in the intensity or the direction of the electric field. The direction of the electric field is perpendicular to the substrates. The LCD device has relatively high transmittance and a large aperture ratio. However, the LCD device may have a narrow viewing angle. To increase the viewing angle, various modes have been proposed. Among these wide angle viewing modes, an in-plane switching (IPS) mode LCD device of the related art will be described with reference to accompanying drawings.

FIG. 1 is a schematic cross-sectional view of an IPS mode LCD device according to the related art. As shown in FIG. 1, the IPS mode LCD device according to the related art includes a lower substrate 10 and an upper substrate 40, and a liquid crystal layer LC interposed between the lower substrate 10 and the upper substrate 40. A thin film transistor T, a common electrode 30 and a pixel electrode 32 are formed in each pixel P on the lower substrate 10. The thin film transistor T includes a gate electrode 14, a semiconductor layer 18, and source and drain electrodes 20 and 22. The semiconductor layer 18 is disposed over the gate electrode 14 with a gate insulating layer 16 therebetween. The source and drain electrodes 20 and 22 are formed on the semiconductor layer 18 and are spaced apart from each other. Each of the common electrode 30 and the pixel electrode 32 includes a plurality of patterns. The common electrode 30 and the pixel electrode 32 are spaced apart from and alternate with each other.

Although not shown in FIG. 1, a gate line is formed along a first side of the pixel P, and a data line is formed along a second side of the pixel P substantially perpendicular to the first side. A common line is further formed on the lower substrate 10. The common line provides the common electrode 30 with voltage.

The upper substrate 40 is spaced apart from the lower substrate 10. A black matrix 42 and a color filter layer including red and green color filters 34a and 34b are formed on an inner surface of the upper substrate 40. The color filter layer further includes a blue color filter (not shown). The black matrix 42 is disposed over the gate line, the data line and the thin film transistor T. The color filter layers 34a and 34b are each disposed in a respective pixel P.

The lower substrate 10, including the thin film transistor T, the common electrode 30 and the pixel electrode 32, may be referred to as an array substrate. Liquid crystal molecules of the liquid crystal layer LC are driven by a horizontal electric field 45 induced between the common electrode 30 and the pixel electrode 32. The upper substrate 40, including the black matrix 42 and the color filter layer 34a and 34b, may be referred to as a color filter substrate.

An array substrate for an IPS mode LCD device of the related art will be described with reference to FIG. 2. More specifically, FIG. 2 is a plan view schematically illustrating an array substrate for an IPS mode LCD device manufactured through 4 mask processes according to the related art. As shown in FIG. 2, a gate line 54 is formed along a direction on an insulating substrate 50. A data line 92 crosses the gate line 54 to define a pixel region P. A gate pad 56 is formed at one end of the gate line 54, and a data pad 92 is formed at one end of the data line 92. A common line 58 is spaced apart from and parallel to the gate line 54. The common line 58 is disposed along a side of the pixel region P. A gate pad terminal GP is formed on the gate pad 56 and contacts the gate pad 56. A data pad terminal DP is formed on the data pad 94 and contacts the data pad 94.

A thin film transistor T is formed adjacent to where the gate line 54 crosses the data line 92. The thin film transistor T includes a gate electrode 52, an active layer 84, an ohmic contact layer (not shown), and source and drain electrodes 88 and 90. The gate electrode 52 is connected to the gate line 54. The active layer 84 and the ohmic contact layer are sequentially disposed on the gate electrode 52. The source and drain electrodes 88 and 90 are disposed on the ohmic contact layer. The source electrode 88 is connected to the data line 92. An intrinsic amorphous silicon pattern 72 is disposed under the data line 92. The drain electrode 90 is spaced apart from the source electrode 88.

A pixel electrode PXL and a common electrode Vcom are formed in the pixel region P. The pixel electrode PXL contacts the drain electrode 90, and the common electrode Vcom contacts the common line 58. The pixel electrode PXL and the common electrode Vcom are spaced apart from each other.

In the array substrate for an IPS mode LCD device according to the related art, the source and drain electrodes 88 and 90, the data line 92 and the active layer 84 are formed through the same process. Therefore, the active layer 84 and the source and drain electrodes 88 and 90, and the intrinsic amorphous silicon pattern 72 and the data line 92 are sequentially layered, wherein the active layer 84 and the intrinsic amorphous silicon pattern 72 are exposed at sides of the source and drain electrodes 88 and 90 and the data line 92.

Here, the active layer 84 and the intrinsic amorphous silicon pattern 72 are exposed to light such that photocurrents may occur therein. The photocurrents in the active layer 84 act as leakage currents, which flow when the thin film transistor is OFF, and causes incorrect operation of the thin film transistor T. The photocurrents in the intrinsic amorphous silicon pattern 72 cause coupling with electrodes adjacent thereto, and liquid crystal molecules (not shown) are improperly arranged due to the coupling. Accordingly, a wavy noise occurs on displayed images. The off-currents in the thin film transistor and the appearance of wavy noise in the display typically occur in an LCD device in which the source electrode, drain electrode and the active layer are patterned through the same process.

FIGS. 3A to 3H, FIGS. 4A to 4H, FIGS. 5A to 5H, and FIGS. 6A to 6H illustrate processes of manufacturing an array substrate for an IPS mode LCD device according to the related art. FIGS. 3A to 3H are cross-sectional views along the line II-II of FIG. 2. FIGS. 4A to 4H are cross-sectional views along the line of FIG. 2. FIGS. 5A to 5H are cross-sectional views along the line IV-IV of FIG. 2. FIGS. 6A to 6H are cross-sectional views along the line V-V of FIG. 2.

FIG. 3A, FIG. 4A, FIG. 5A, and FIG. 6A show a first mask process. As shown in FIG. 3A, FIG. 4A, FIG. 5A, and FIG. 6A, a switching region S, a pixel region P, a gate region G, a data region D, and a common signal region CS are defined on a substrate 50. A gate line 54 of FIG. 2 and a gate electrode 50 are formed on the substrate 50 including the regions S, P, G, D and CS. The gate line 54 is disposed in the gate region G and extends along a first direction. The gate line 54 includes a gate pad 56 at one end thereof. The gate electrode 52 is connected to the gate line 54 and is disposed in the switching region S. Simultaneously, a common line 58 is formed in the common signal region CS. The common line 58 is spaced apart from and parallel to the gate line 54.

The gate line 54, the gate pad 56, the gate electrode 52 and the common line 58 are formed by depositing one or more material selected from a conductive metallic group including aluminum (Al), aluminum alloy (AlNd), tungsten (W), chromium (Cr), and molybdenum (Mo). The gate line 54, the gate pad 56, the gate electrode 52 and the common line 58 may be a single layer of the above-mentioned metallic material or may be a double layer of aluminum (Al)/chromium (Cr) or aluminum (Al)/molybdenum (Mo).

FIGS. 3B to 3F, FIGS. 4B to 4F, FIGS. 5B to 5F and FIGS. 6B to 6F show a second mask process. As shown in FIG. 3B, FIG. 4B, FIG. 5B and FIG. 6B, a gate insulating layer 60, an intrinsic amorphous silicon layer (a-Si:H) 62, an impurity-doped amorphous silicon layer (n+ or p+ a-Si:H) 64, and a conductive metallic layer 66 are formed over the entire surface of the substrate 50, including the gate line 54, the gate pad 56, the gate electrode 52 and the common line 58. The gate insulating layer 60 is formed by depositing one or more material selected from an inorganic insulating material group, including silicon nitride ($SiN_x$) and silicon oxide ($SiO_2$). The conductive metallic layer 66 is formed by depositing one or more material selected from the above-mentioned conductive metallic group.

A photoresist layer 68 is formed by coating the entire surface of the substrate 50, including the conductive metallic layer 66 with photoresist. A mask M is disposed over the photoresist layer 68. The mask M includes a light-transmitting portion B1, a light-blocking portion B2, and a light-half transmitting portion B3. The light-transmitting portion B1 transmits substantially all light. The photoresist layer 68 below the light-transmitting portion B1 is entirely exposed to light to thereby chemically change. The light-blocking portion B2 completely blocks the light. The light-half transmitting portion B3 includes slits or a half transparent layer to decrease the intensity of light or transmittance of the light. Thus, the photoresist layer is partially exposed to light through the light-half transmitting portion B3.

The light-half transmitting portion B3 is disposed over the gate electrode 52 in the switching region S. The light-blocking portion B2 is disposed over the photoresist layer 68 in the switching region S and in the data region D. In the switching region S, the light-blocking portion B2 is disposed at both sides of the light-half transmitting portion B3. The light-transmitting portion B1 is disposed in other regions except form the switching region S and the data region D. The photoresist layer 68 is exposed to light through the mask M and then is developed.

Referring to FIG. 3C, FIG. 4C, FIG. 5C and FIG. 6C, first and second photoresist patterns 70a and 70b are formed in the switching region S and the data region D, respectively. The first photoresist pattern 70a has a first portion corresponding to the gate electrode 52 and a second portion corresponding to the switching region S except form the gate electrode 52. The second portion is thicker than the first portion.

Next, the conductive metallic layer 66, the impurity-doped amorphous silicon layer 64, and the intrinsic amorphous silicon layer 62 are selectively removed by using the first and second photoresist patterns 70a and 70b as an etching mask. The conductive metallic layer 66 may be removed simultaneously with the under layers 64 and 62 according to a material of the conductive metallic layer 66. Alternatively, the conductive metallic layer 66 may be wet-etched. Then, the impurity-doped amorphous silicon layer 64 and the intrinsic amorphous silicon layer 62 may be dry-etched.

As shown in FIG. 3D, FIG. 4D, FIG. 5D and FIG. 6D, a first metallic pattern 78 and a second metallic pattern 82 are formed under the first and second photoresist patterns 70a and 70b, respectively. A first semiconductor pattern 76 and a second semiconductor pattern 80 are formed under the first metallic pattern 78 and the second metallic pattern 82, respectively. Each of the first and second semiconductor patterns 76 and 80 includes an intrinsic amorphous silicon pattern 72 and an impurity-doped amorphous silicon pattern 74.

As shown in FIG. 3E, FIG. 4E, FIG. 5E and FIG. 6E, an ashing process is performed to remove a first portion of the first photoresist pattern 70a corresponding to the gate electrode 52, and the first metallic pattern 78 corresponding to the gate electrode 52 is exposed. At this time, other parts of the first photoresist pattern 70a and the second photoresist pattern 70b are also partially removed. The first and second metallic patterns 78 and 82 are partially exposed at peripheries of the first and second photoresist patterns 70a and 70b. Then, the exposed first metallic pattern 78 and the impurity-doped amorphous silicon pattern 74 of the first semiconductor layer 76 are removed.

Referring to FIG. 3F, FIG. 4F, FIG. 5F and FIG. 6F, a source electrode 88, a drain electrode 90 and a data line 92 are formed. The data line 92 is formed in a second direction crossing the first direction. A data pad 94 is formed at one end of the data line 92. The intrinsic amorphous silicon pattern 72 of the first semiconductor pattern 76 of FIG. 3E over the gate electrode 52 functions as an active layer 84, and the impurity-doped amorphous silicon pattern 74 of the first semiconductor pattern 76 of FIG. 3E, which is now divided into two parts, acts as an ohmic contact layer 86. When the impurity-doped amorphous silicon pattern 74 of the first semiconductor pattern 76 of FIG. 3E is partially removed, the intrinsic amorphous silicon pattern, i.e., the active layer 84, is over-etched so that particles may not remain on the surface of the active layer 84. Next, the photoresist patterns 70a and 70b are removed.

FIG. 3G, FIG. 4G, FIG. 5G and FIG. 6G show a third mask process. As shown in FIG. 3G, FIG. 4G, FIG. 5G and FIG. 6G, a passivation layer 96 is formed substantially over an entire surface of the substrate 50, including the source and drain electrodes 88 and 90 and the data line 92 including the data pad 94. The passivation layer 96 may be formed by depositing one selected from an inorganic insulating material group, including silicon nitride (SiNx) and silicon oxide ($SiO_2$). Alternatively, the passivation layer 96 may be formed by coating the substrate 50 with one selected from an organic insulating material group, including benzocyclobutene (BCB) and acrylic resin.

Subsequently, the passivation layer 96 is patterned to thereby form a drain contact hole 98a, a common line contact hole 98b, a gate pad contact hole 98c, and a data pad contact hole 98d. The drain contact hole 98a partially exposes the drain electrode 90. The common line contact hole 98b partially exposes the common line 58. The gate pad contact hole 98c partially exposes the gate pad 56. The data pad contact hole 98d partially exposes the data pad 94.

FIG. 3H, FIG. 4H, FIG. 5H and FIG. 6H show a fourth mask process. As shown in FIG. 3H, FIG. 4H, FIG. 5H and FIG. 6H, a pixel electrode PXL and a common electrode Vcom are formed in the pixel region P by depositing one selected from a transparent conductive metallic group, including indium tin oxide (ITO) and indium zinc oxide (IZO), on the substrate 650 including the passivation layer 96, and then patterning it. The pixel electrode PXL contacts the drain electrode 90, and the common electrode Vcom contacts the common line 58. Each of the pixel electrode PXL and the common electrode Vcom includes a plurality patterns parallel to the data line 92. The common electrode Vcom alternates with the pixel electrode PXL. A gate pad terminal GP and a data pad terminal DP are formed simultaneously with the pixel electrode PXL and the common electrode Vcom. The gate pad terminal GP contacts the gate pad 56. The data pad terminal DP contacts the data pad 94.

The array substrate for an IPS mode LCD device may be manufactured through the above-mentioned four mask processes. Since the active layer and the source and drain electrodes are formed through the same process, the manufacturing costs and time can be reduced. The probability that problems may occur also decreases. However, in the array substrate manufactured through four mask processes, the second semiconductor pattern 80 is formed under the data line 92, and the intrinsic amorphous silicon pattern 72 of the second semiconductor pattern 80 is exposed at sides of the data line 92. As stated above, the exposed intrinsic amorphous silicon pattern 72 is affected by light and causes wavy noise in images that are displayed. In addition, the active layer 84 also goes beyond the gate electrode 52 and is exposed to light. Thus, photocurrents in the active layer 84 occur which cause the thin film transistor works incorrectly.

BASIC SUMMARY OF THE INVENTION

Accordingly, embodiments of the present invention are directed to an array substrate for an in-plane switching mode liquid crystal display device and a method of manufacturing the same that substantially obviates one or more problem due to limitations and disadvantages of the related art.

An object of embodiments of the invention is to provide an array substrate for an in-plane switching mode liquid crystal display device and a method of manufacturing the same that minimize leakage currents and prevent wavy noise on displayed images.

Another object is to provide an array substrate for an in-plane switching mode liquid crystal display device and a method of manufacturing the same that decrease manufacturing costs and time.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the array substrate for a liquid crystal display device includes a substrate, a gate line on the substrate, a thin film transistor including a gate electrode of the gate line, a gate insulating layer over the gate electrode, an active layer on the gate insulating layer and ohmic contact layers on the active layer, and source and drain electrodes over the ohmic contact layers, a pixel electrode electrically connected to the drain electrode, a data line electrically connected to the source electrode and crossing the gate line, a common electrode spaced apart from the pixel electrode, and a passivation layer directly between the pixel electrode and the common electrode and directly between the source and drain electrodes. It is to be understood that both the foregoing general description and the following detailed description are exemplary and explanatory and are intended to provide further explanation of the invention as claimed.

In another aspect, a method of manufacturing a liquid crystal display device with a substrate having a switching region, a pixel region, and a data region and common signal region defined thereon includes forming a gate line with a gate electrode in the switch region and a common line in the common signal region, forming a gate insulating layer, an active layer, an ohmic contact layer in at least a portion of the switching region together with just the gate insulating layer in the pixel region, forming source and drain electrodes over ohmic contact layers by creating an opening to the active layer between the source and drain electrodes, forming a data line electrically connected to the source electrode and crossing the gate line, forming a pixel electrode electrically connected to the drain electrode and a common electrode spaced apart from the pixel electrode, and forming a passivation layer on the gate insulating layer between the pixel electrode and the common electrode and on the active layer between the source and drain electrodes.

In yet another aspect, a method of manufacturing an array substrate for a liquid crystal display device includes forming a gate electrode and a gate line on a substrate through a first mask process, forming a gate insulating layer, an active layer, an ohmic contact layer and a data line sequentially disposed on the substrate including the gate electrode and the gate line through a second mask process, forming a source electrode, a drain electrode, a common electrode and a pixel electrode on the substrate through a third mask process, and forming a passivation layer between the common electrode and the pixel electrode and on the active layer between source and drain electrodes.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

In embodiments of the present invention, an array substrate is manufactured through three mask processes in which an active layer of an island shape is formed over a gate electrode such that the source and drain ends of the active layer are not exposed to light from the backlight. Because the source and drain ends of the active layer are not exposed to light from the backlight, there is no photocurrent generated in the active layer. Thus, wavy noise is prevented.

Figure 1:
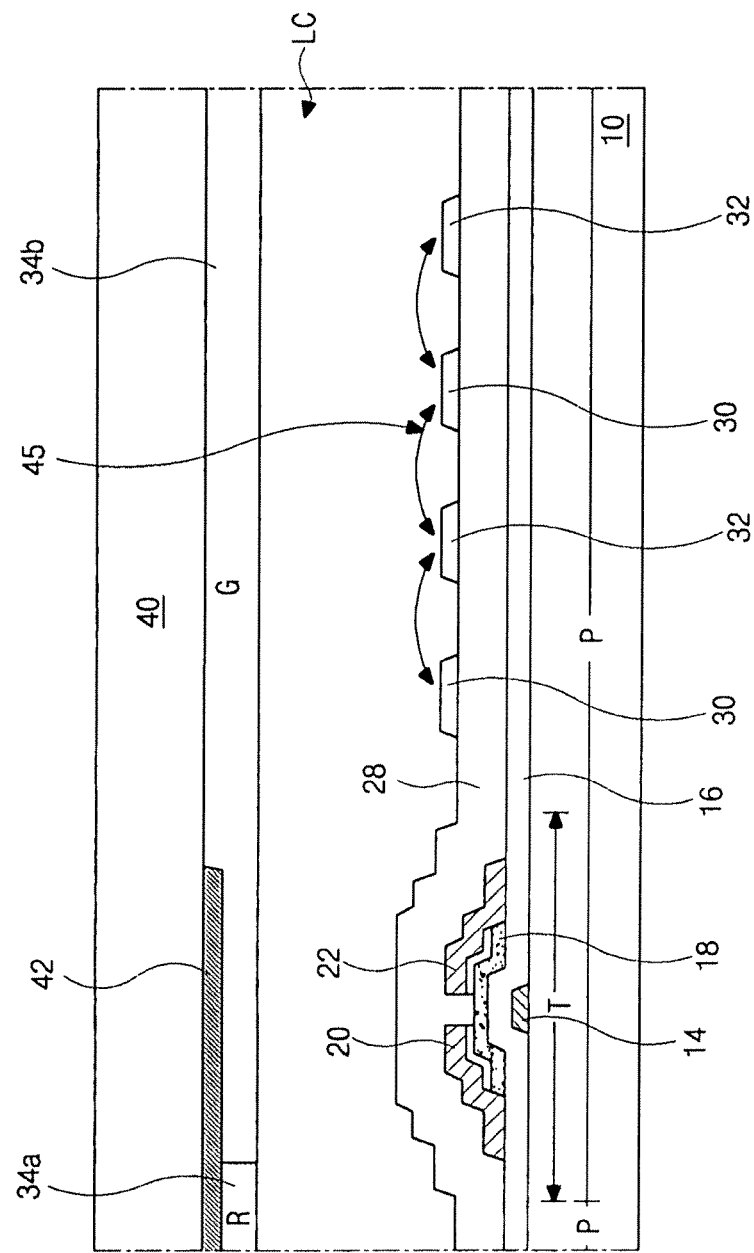
FIG. 1 is a schematic cross-sectional view of an IPS mode LCD device according to the related art.
Figure 2:
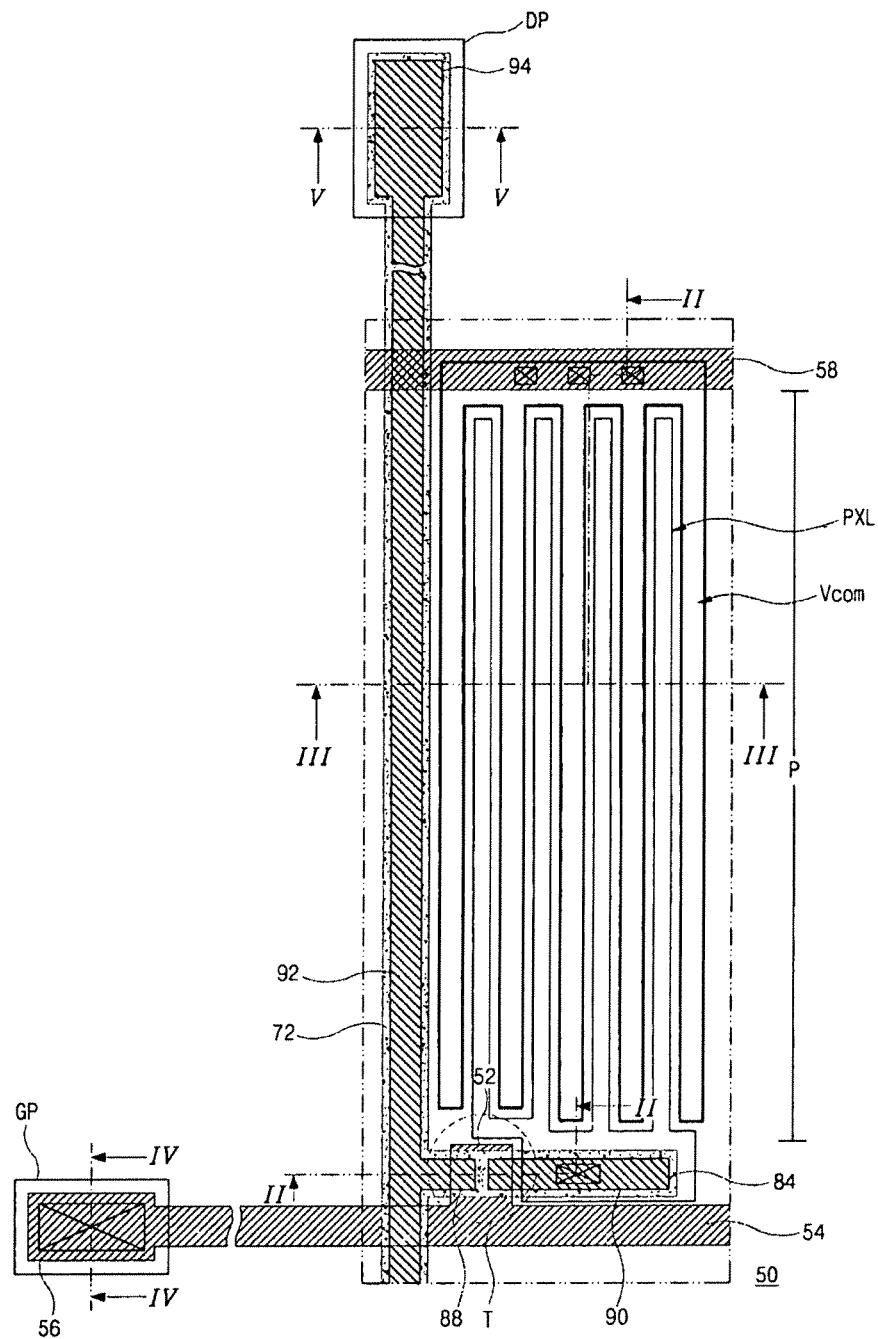
FIG. 2 is a plan view schematically illustrating an array substrate for an IPS mode LCD device according to the related art.
Figure 3A:
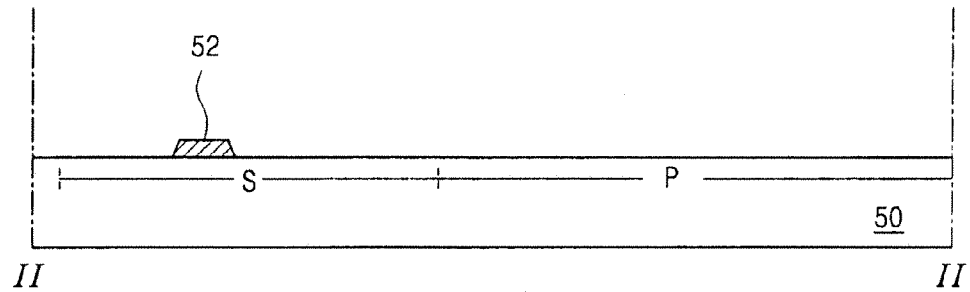
FIGS. 3A to 3H, FIGS. 4A to 4H, FIGS. 5A to 5H, and FIGS. 6A to 6H are cross-sectional views a method of manufacturing an array substrate for an IPS mode LCD device according to the related art.
Figure 3B:
Figure 3B:
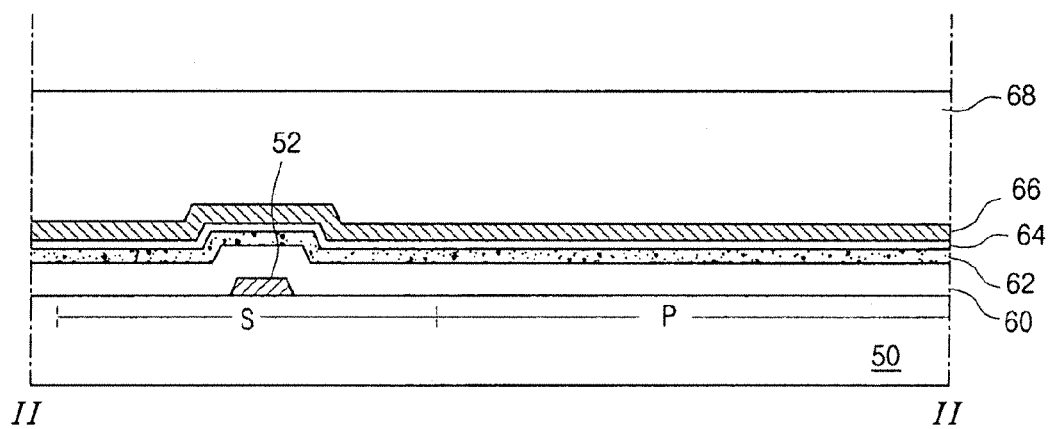
Figure 3C:
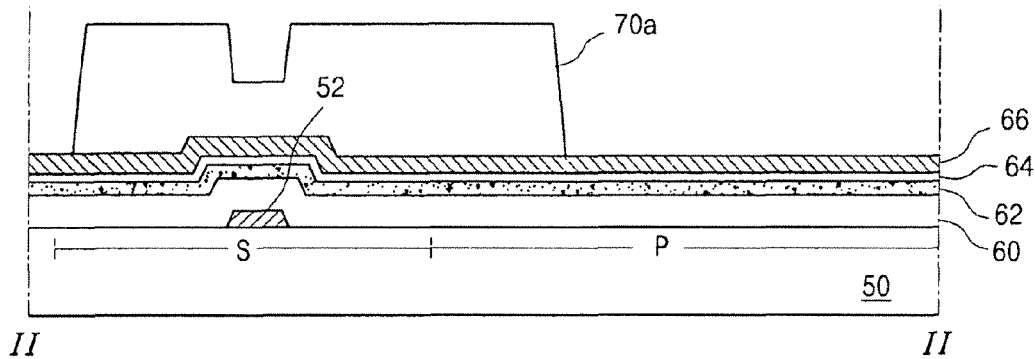
Figure 3D:
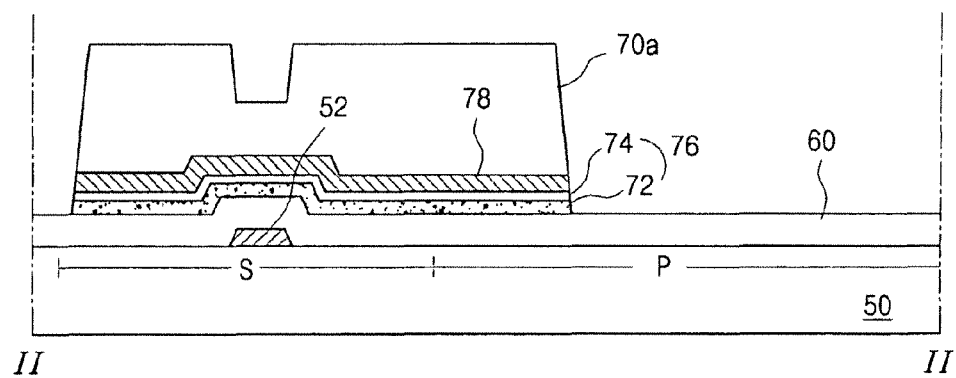
Figure 3E:
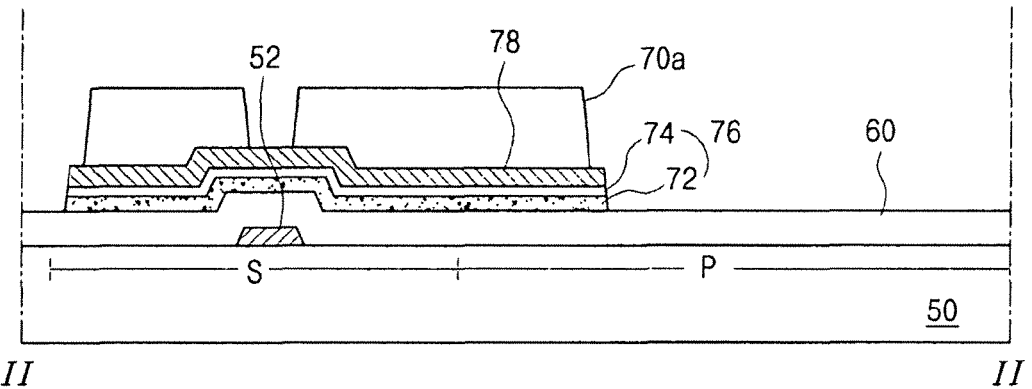
Figure 3F:
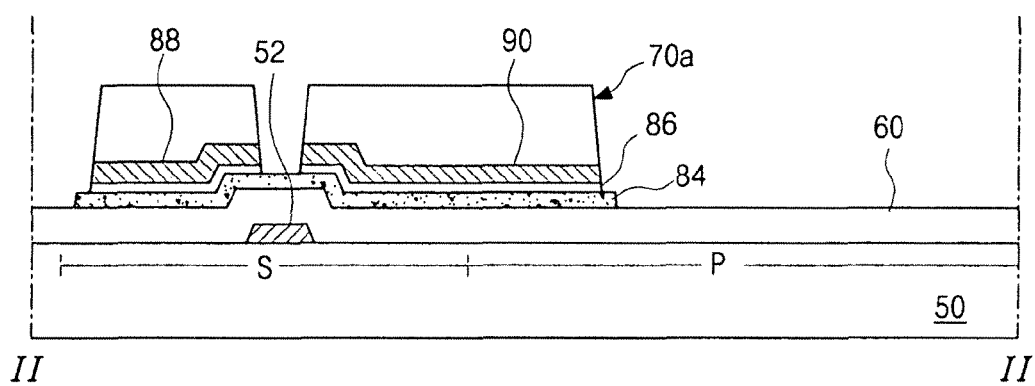
Figure 3G:
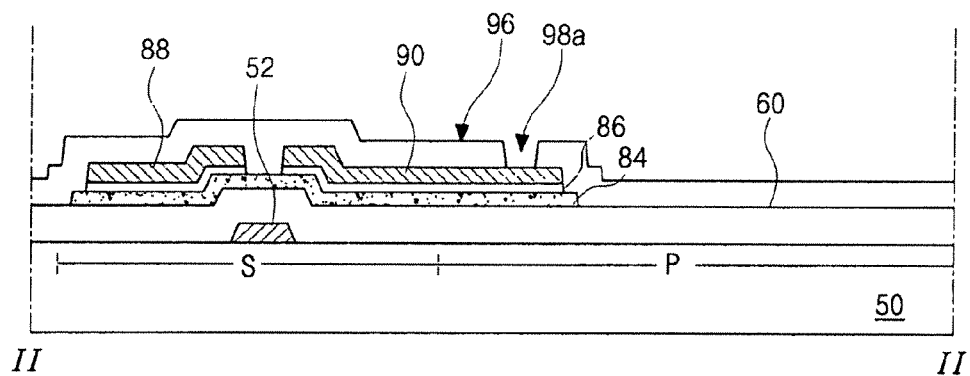
Figure 3H:
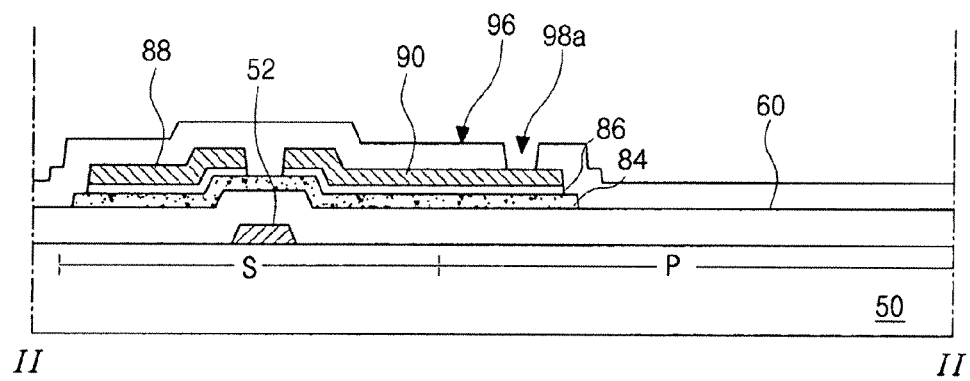
Figure 4A:
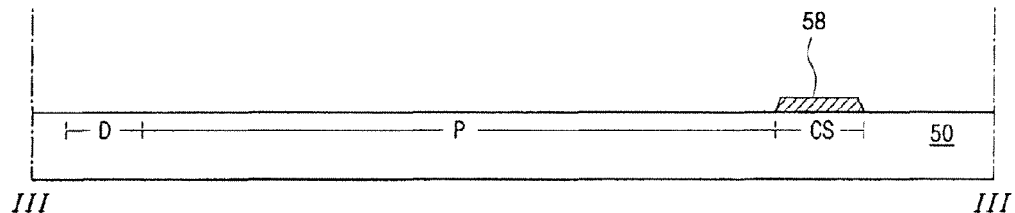
Figure 4B:
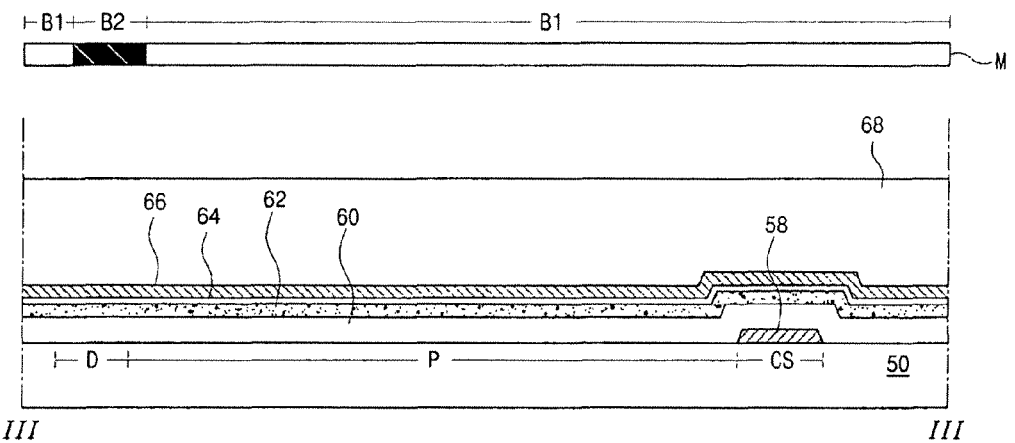
Figure 4C:
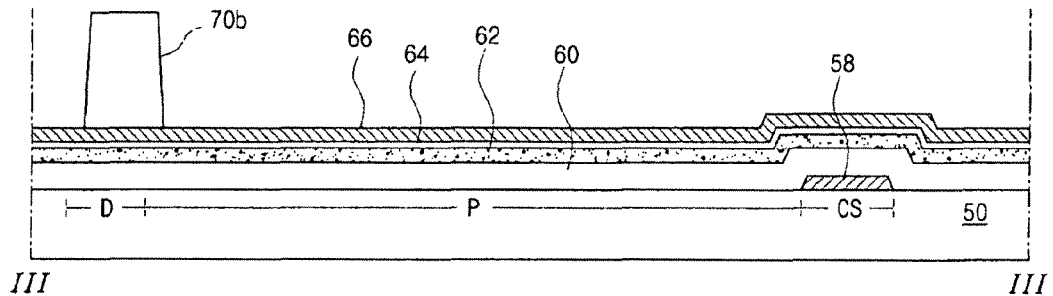
Figure 4D:
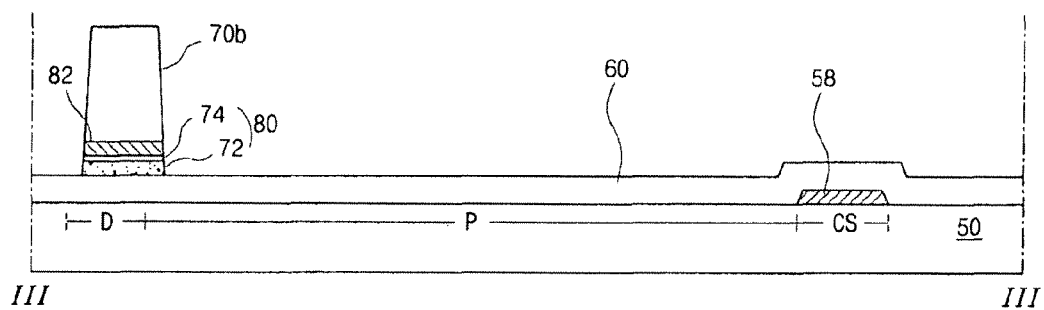
Figure 4E:
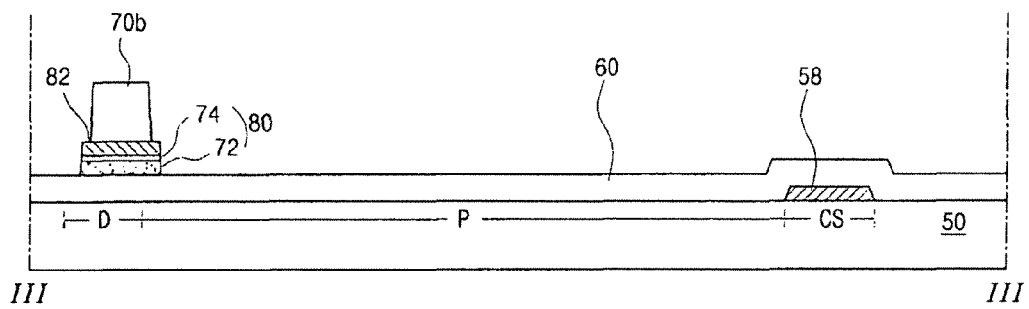
Figure 4F:
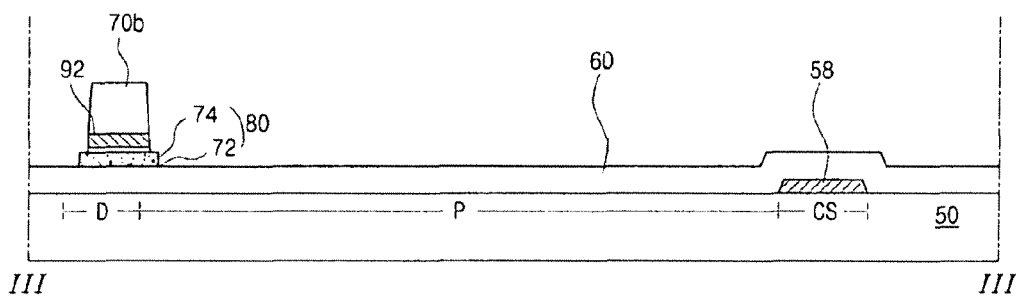
Figure 4G:
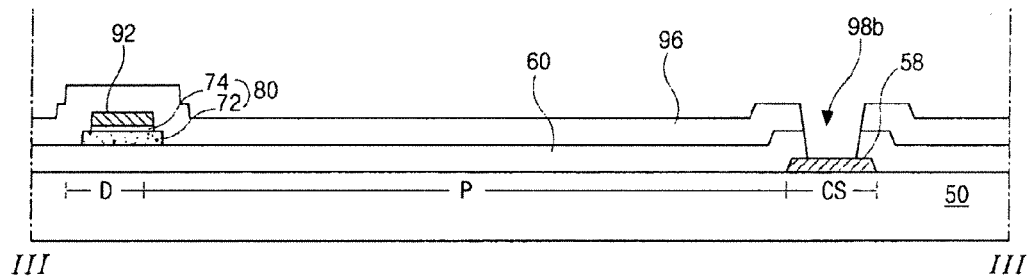
Figure 4H:
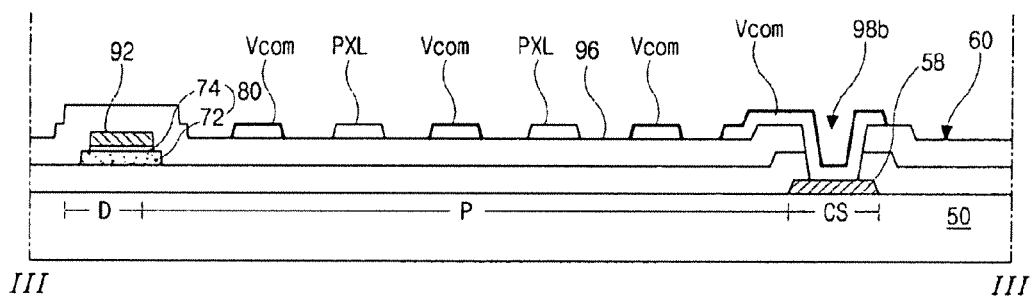
Figure 5A:
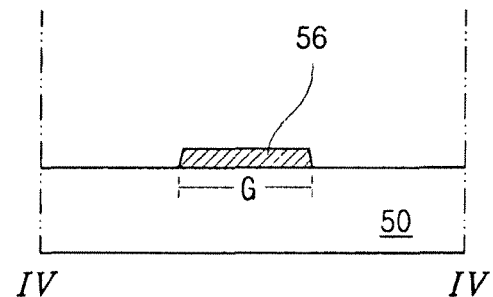
Figure 5B:
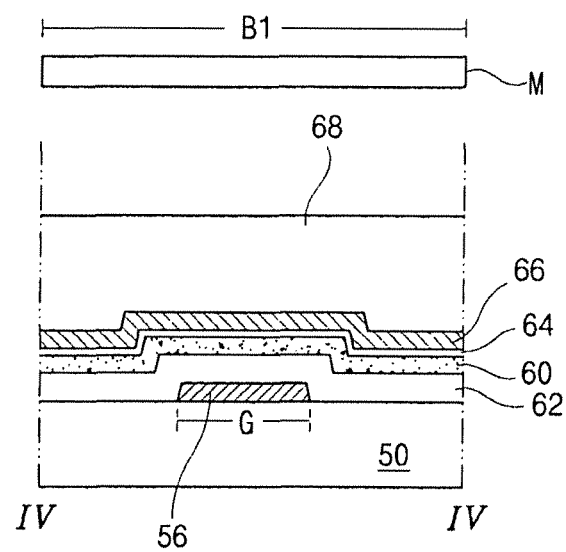
Figure 5C:
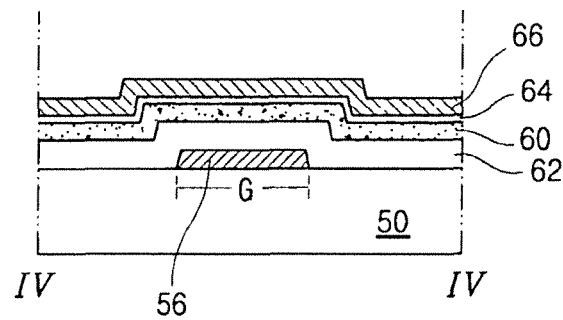
Figure 5D:
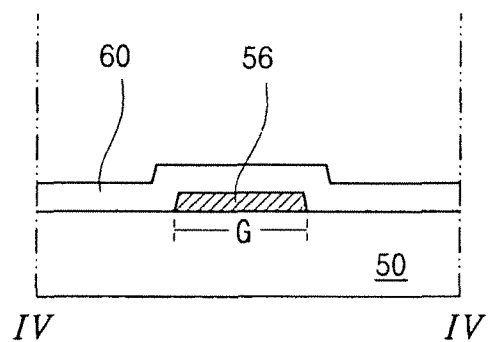
Figure 5E:
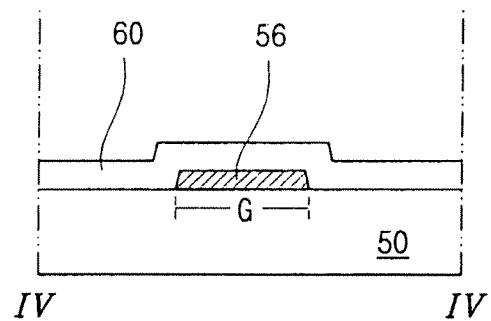
Figure 5F:
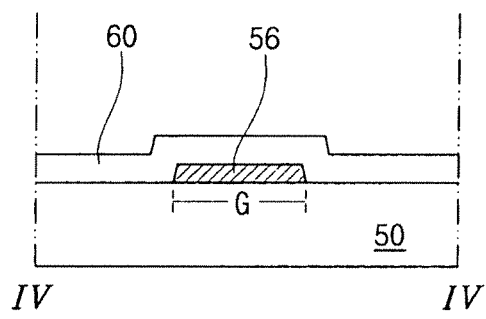
Figure 5G:
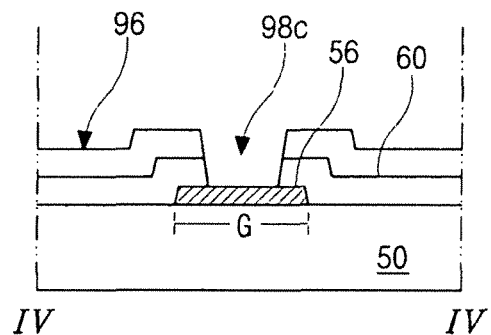
Figure 5H:
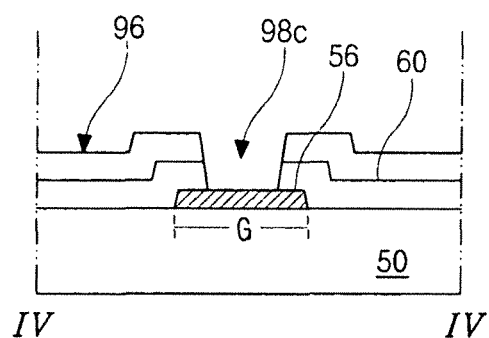
Figure 6A:
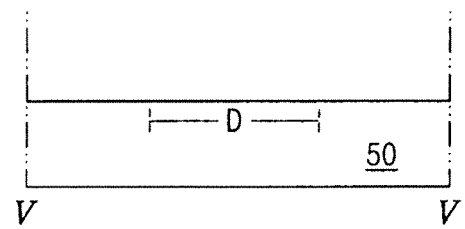
Figure 6B:
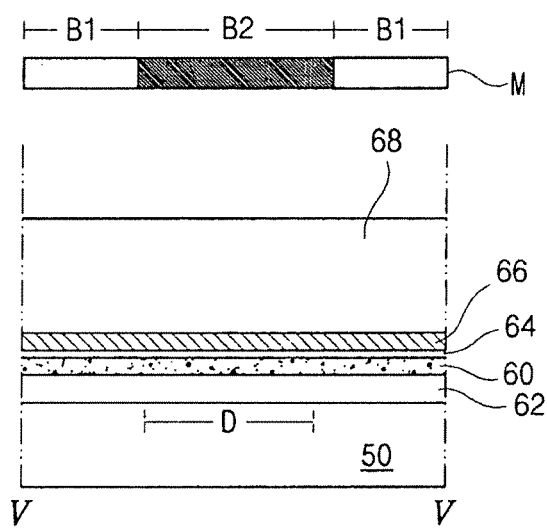
Figure 6C:
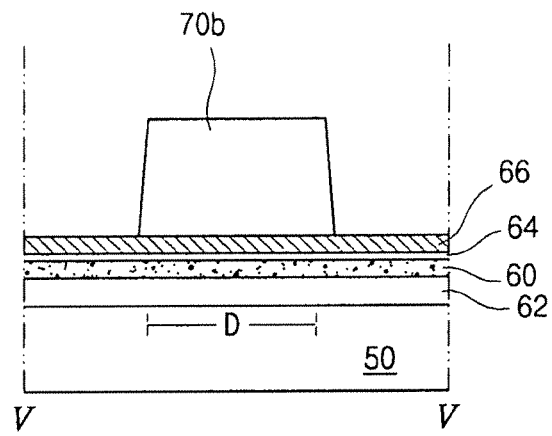
Figure 6D:
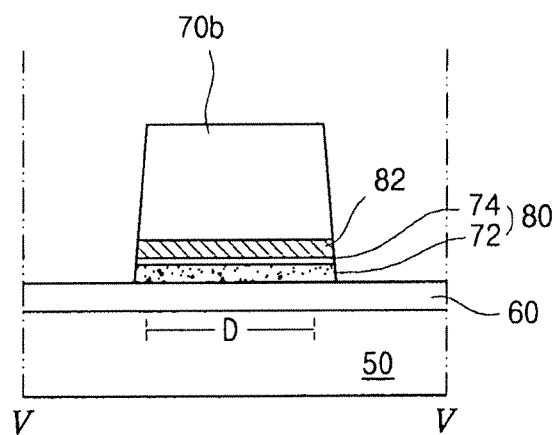
Figure 6E:
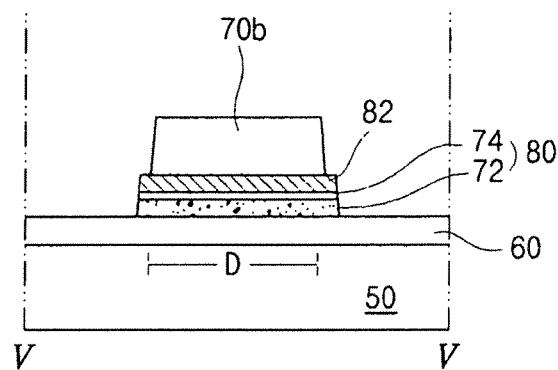
Figure 6F:
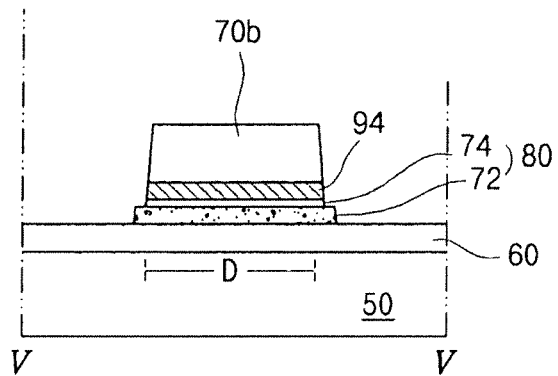
Figure 6G:
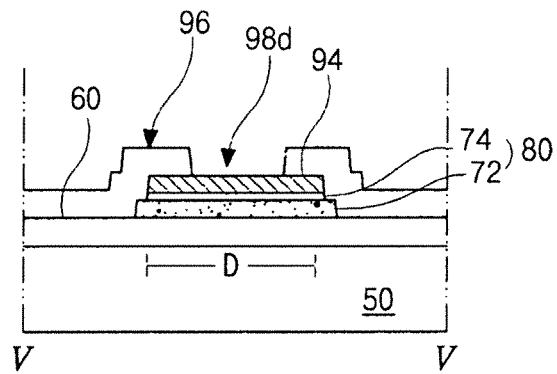
Figure 6H:
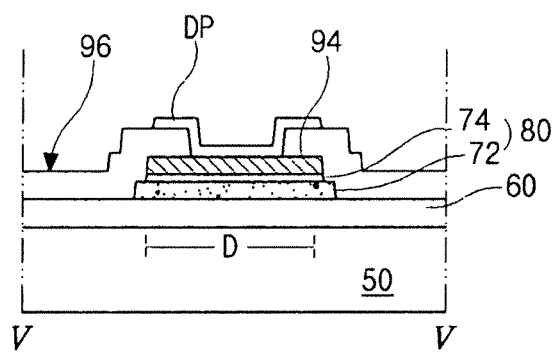
Figure 7:
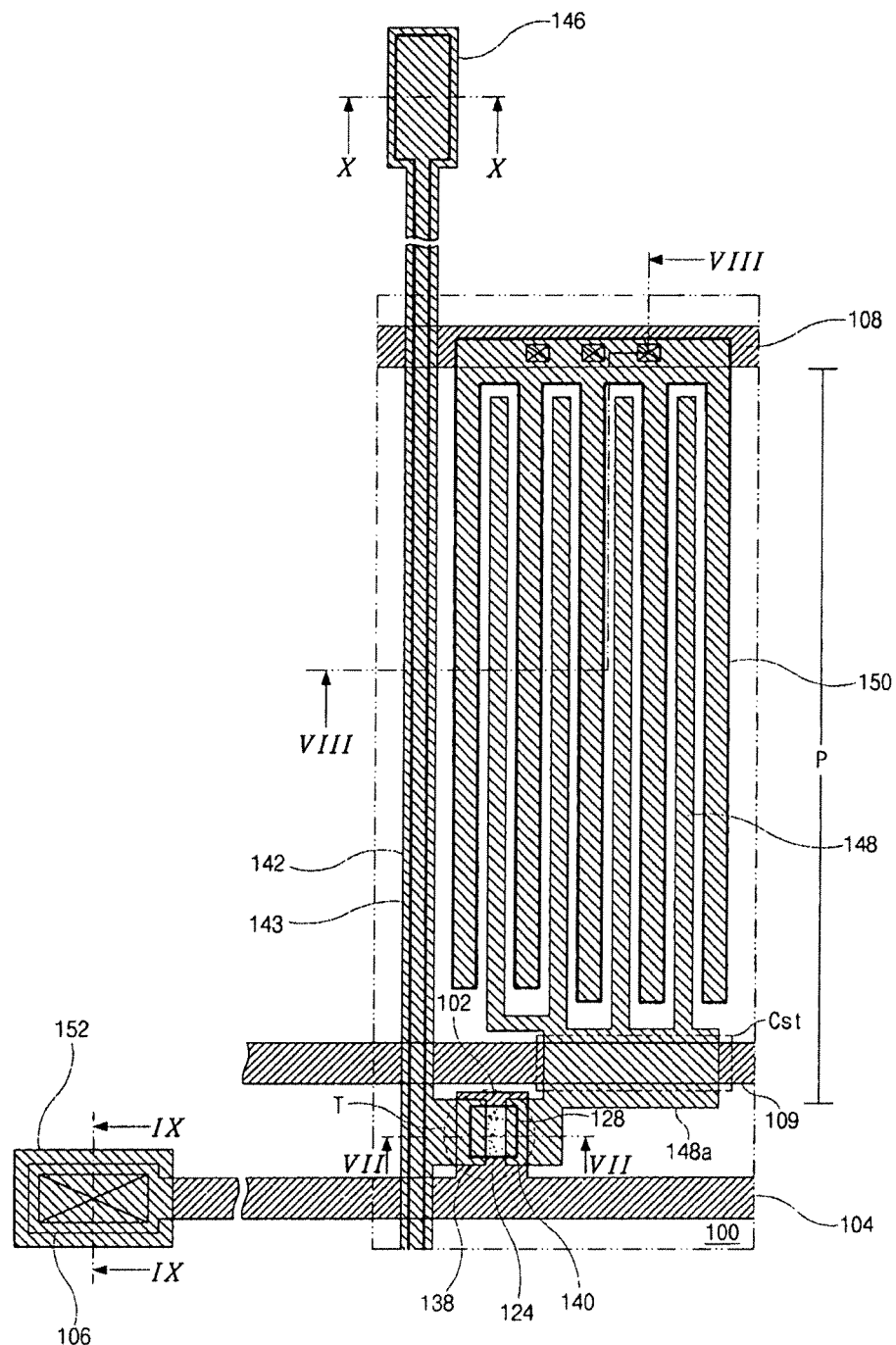
FIG. 7 is a plan view of an array substrate for an IPS mode LCD device according to a first embodiment of the invention.
Figure 8A:
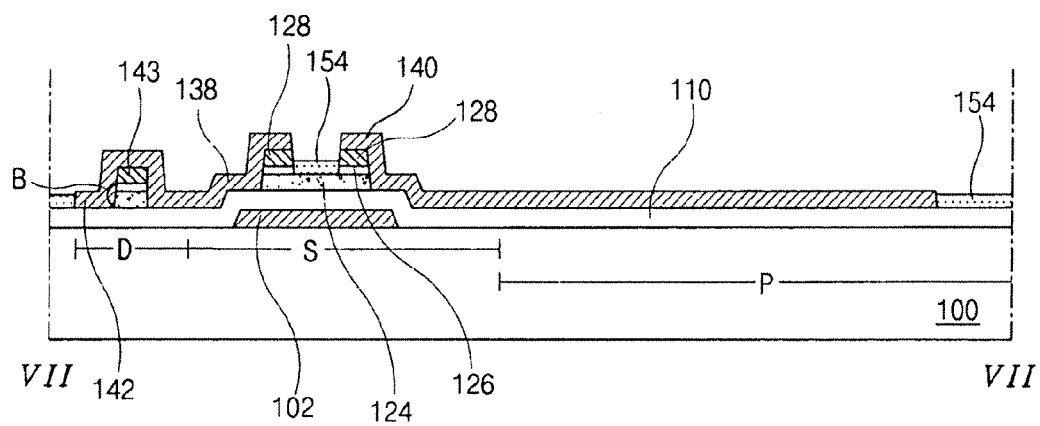
FIGS. 8A to 8D are cross-sectional views of an array substrate for an IPS mode LCD device according to the first embodiment of the invention.
Figure 8B:
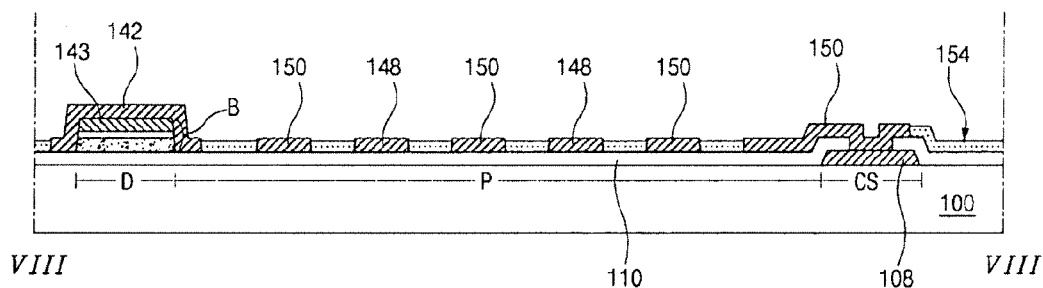
Figure 8C:
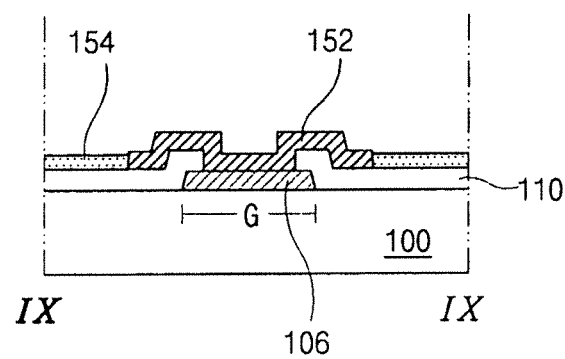
Figure 8D:
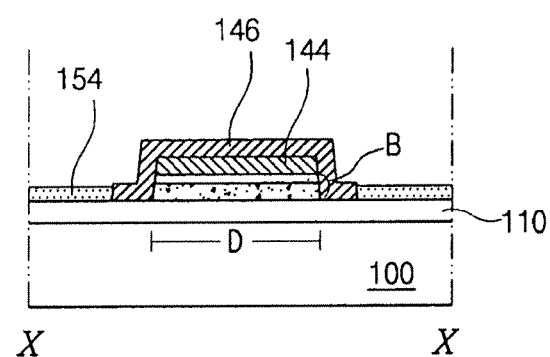
Figure 9A:
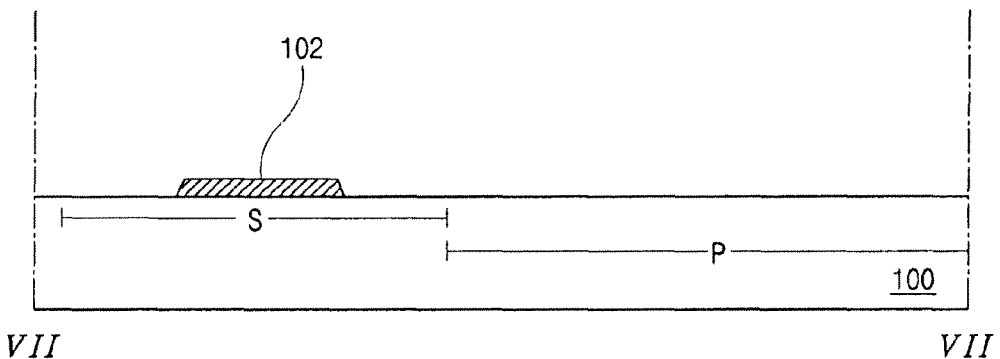
FIGS. 9A to 9I, FIGS. 10A to 10I, FIGS. 11A to 11I, and FIGS. 12A to 12I are cross-sectional views illustrating a method of manufacturing an array substrate according to the first embodiment of the invention.
Figure 9B:
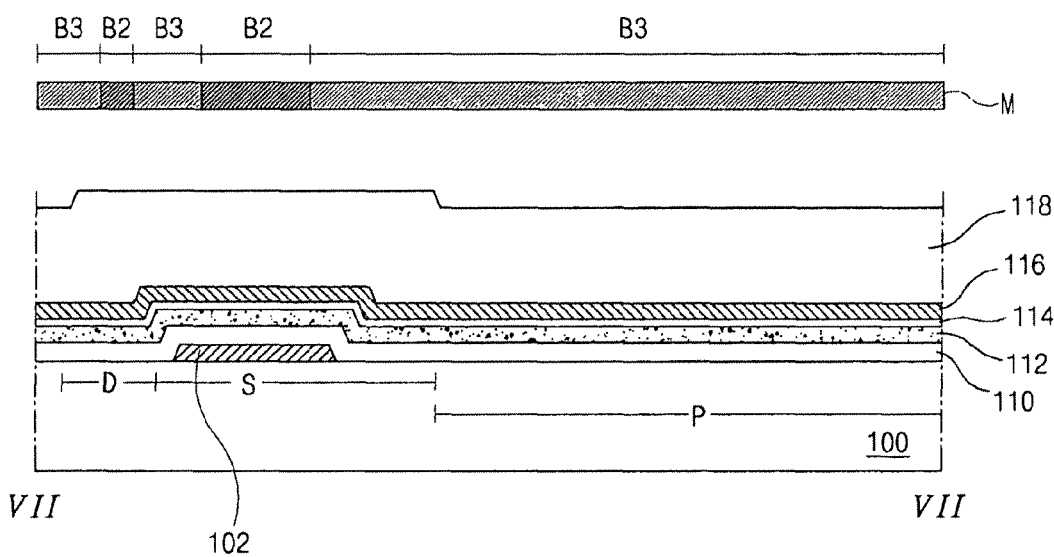
Figure 9C:
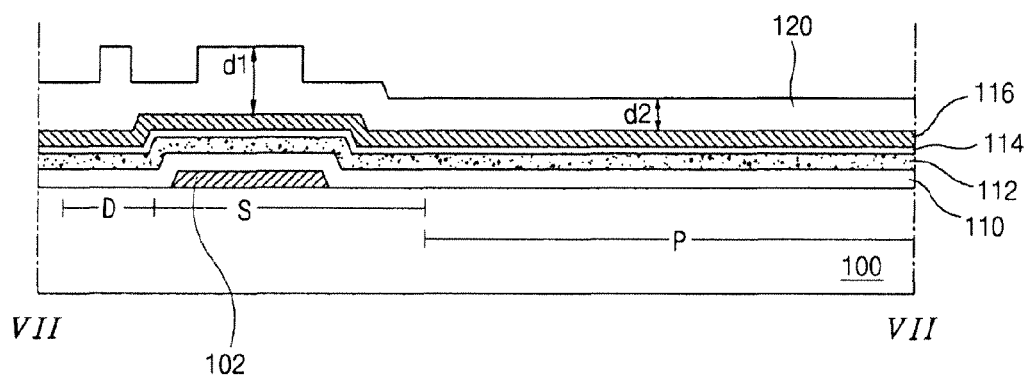
Figure 9D:
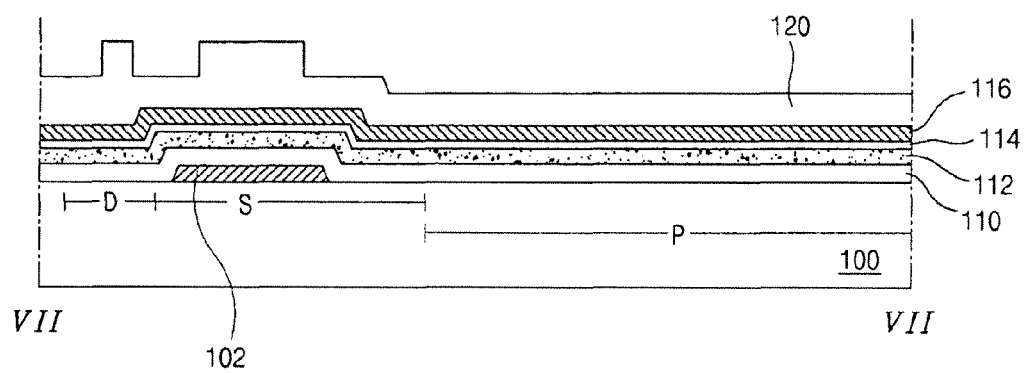
Figure 9E:
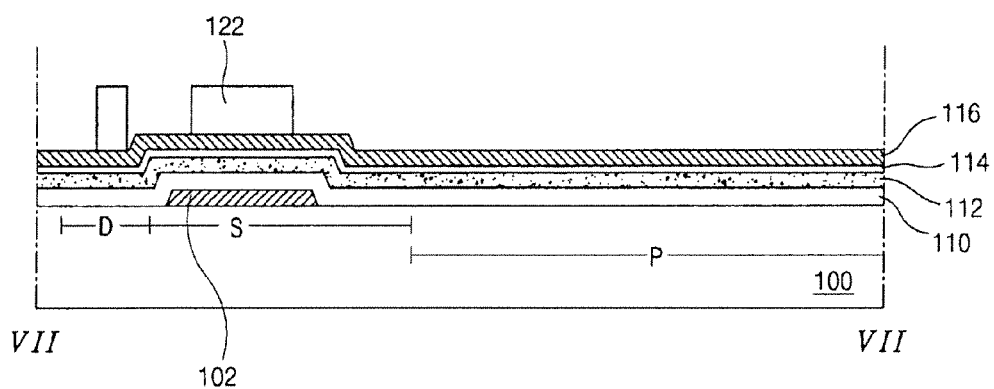
Figure 9F:
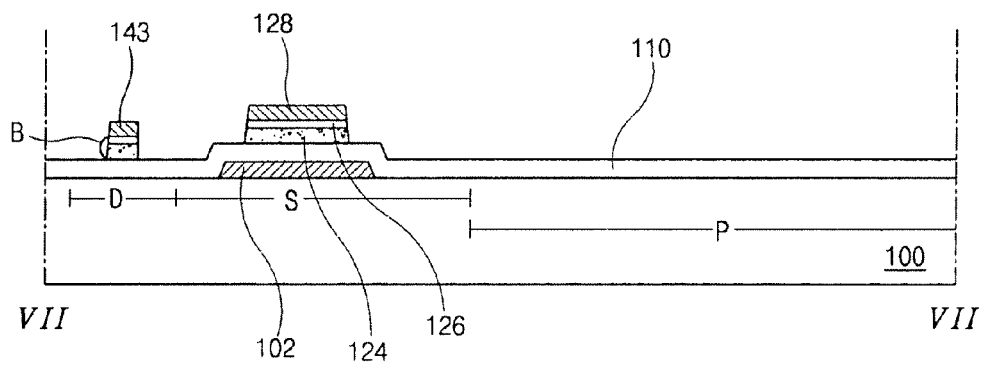
Figure 9G:
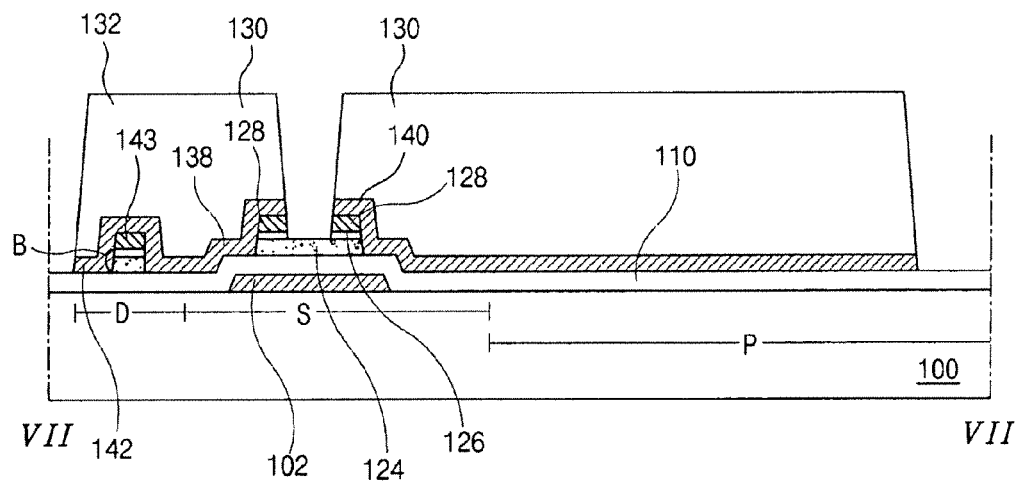
Figure 9H:
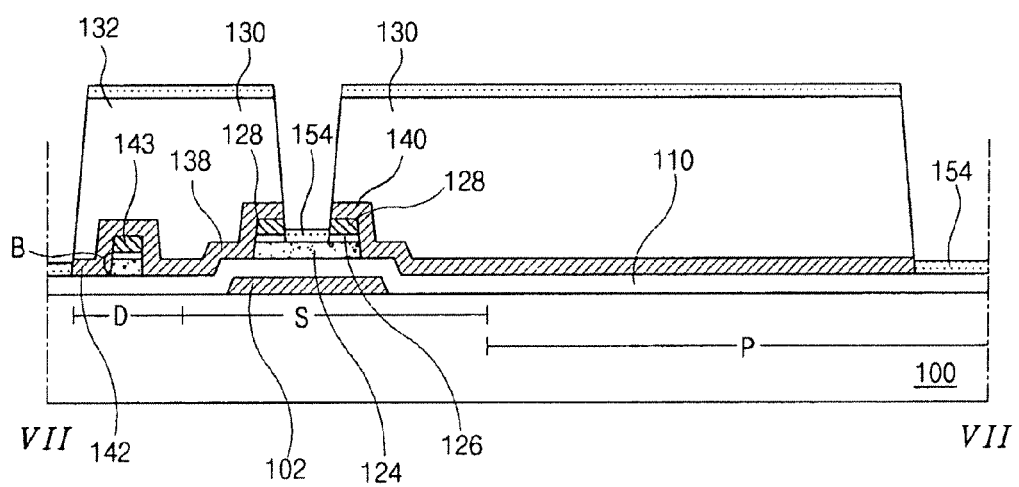
Figure 9I:
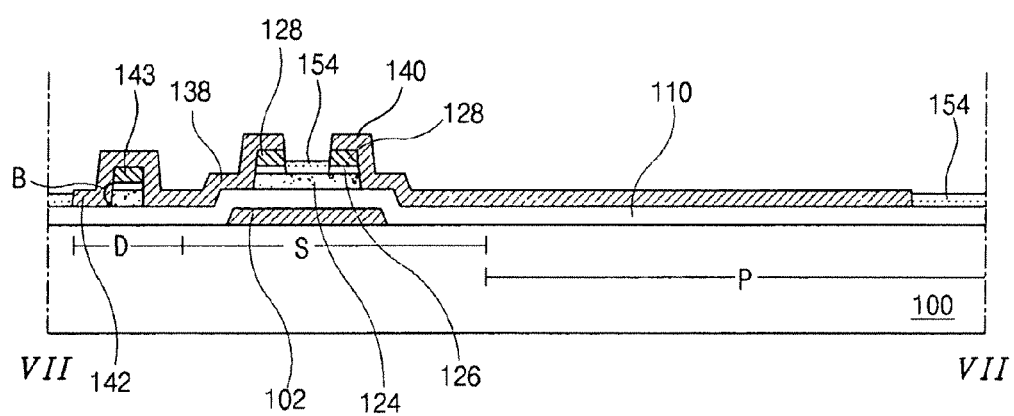
Figure 10A:
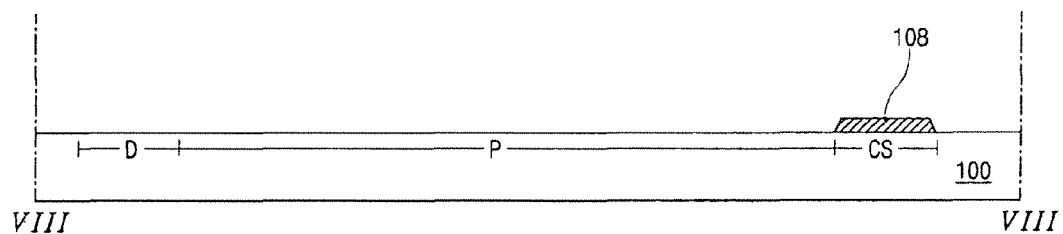
Figure 10B:
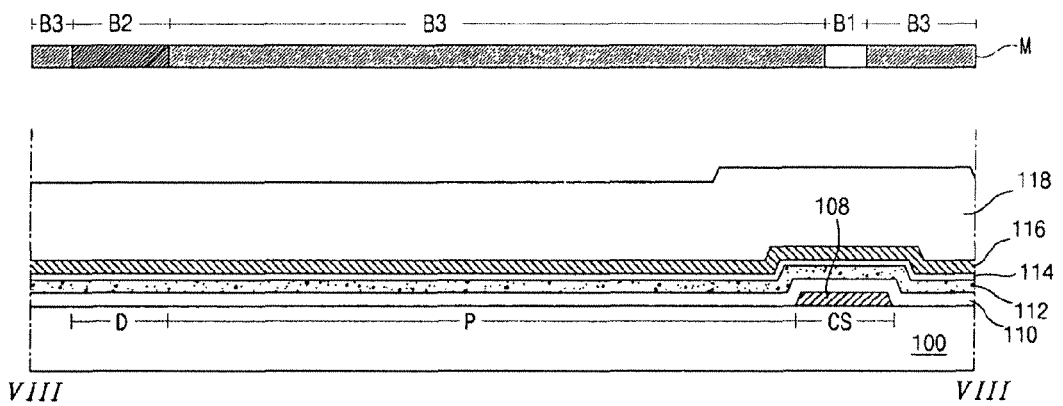
Figure 10C:
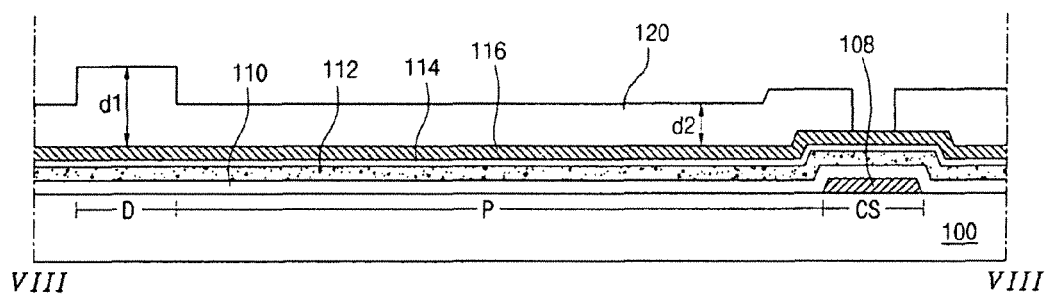
Figure 10D:
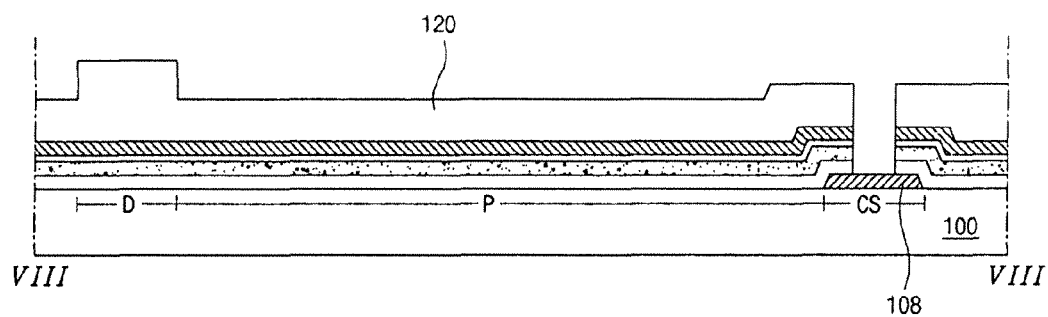
Figure 10E:
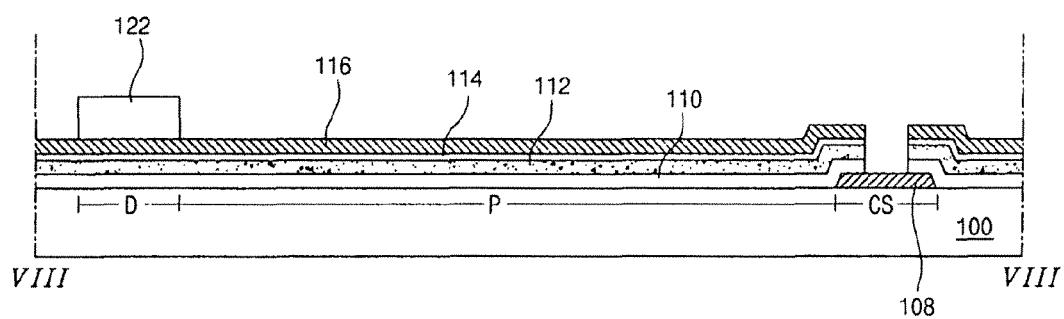
Figure 10F:
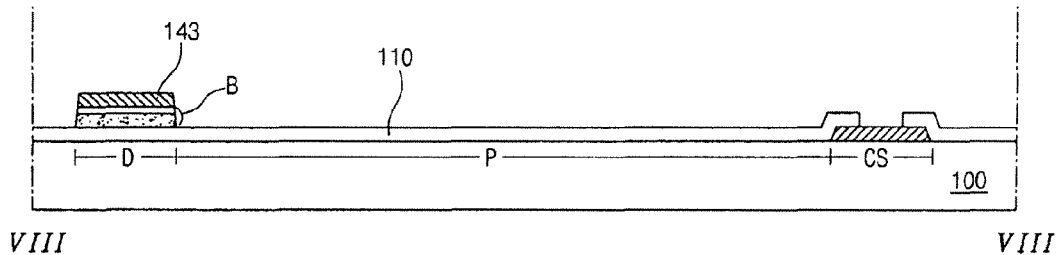
Figure 10G:
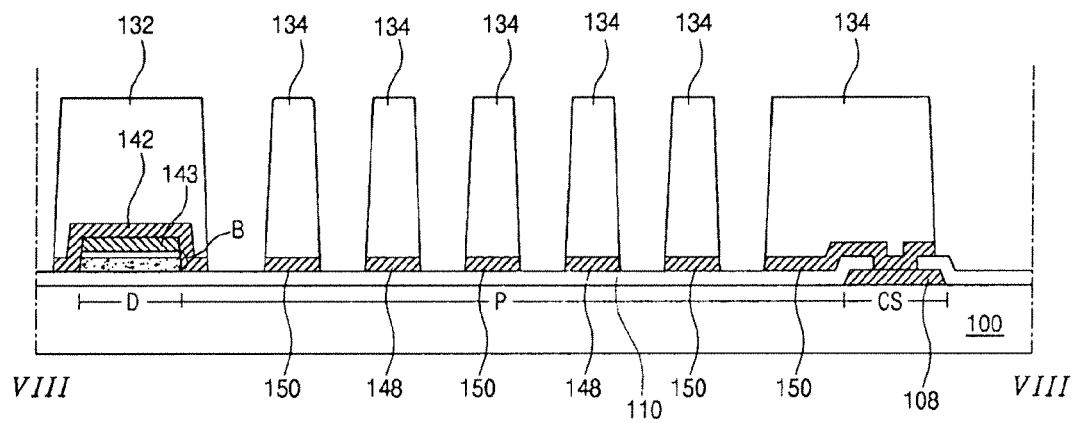
Figure 10H:
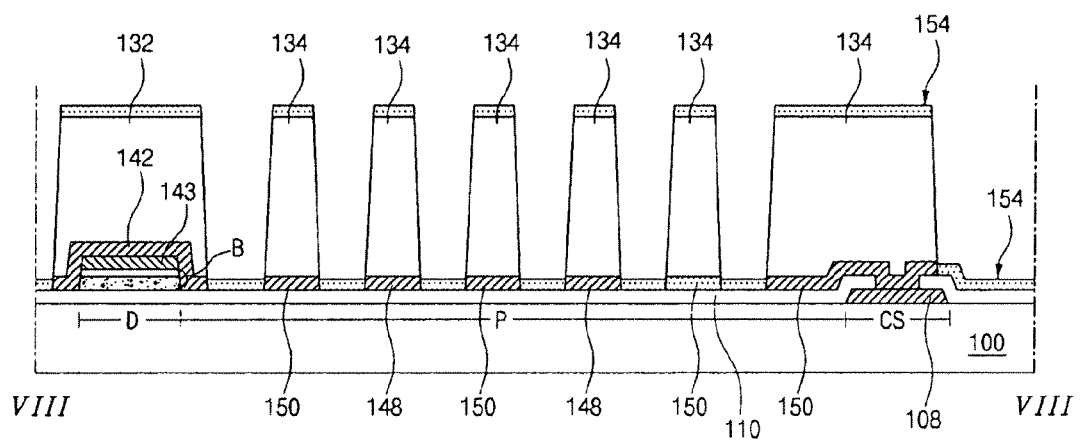
Figure 10I:
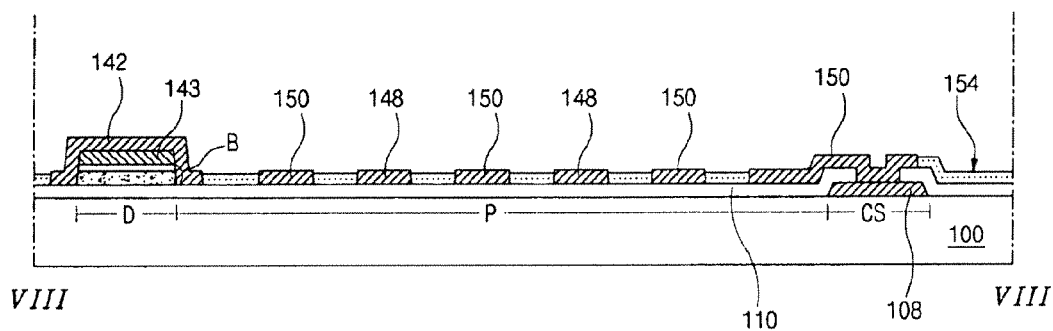
Figure 11A:
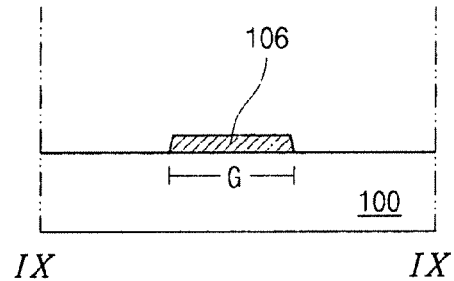
Figure 11B:
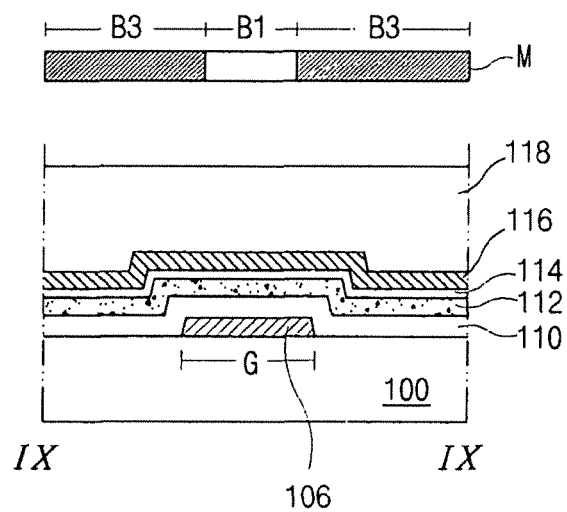
Figure 11C:
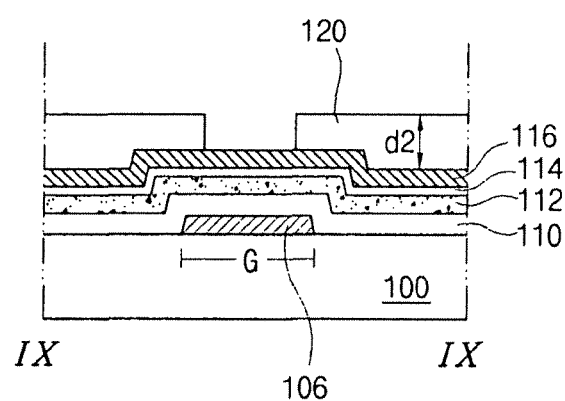
Figure 11D:
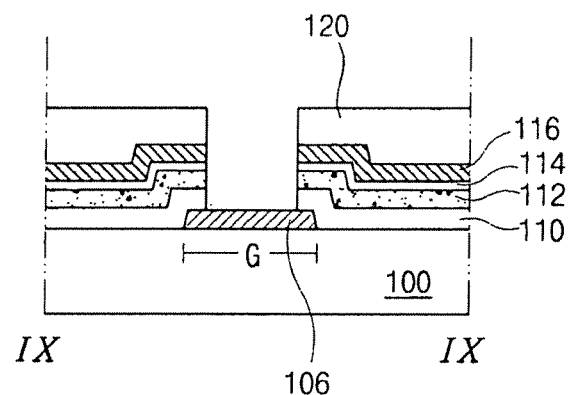
Figure 11E:
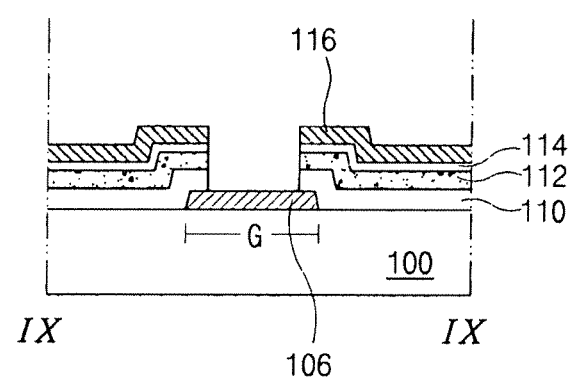
Figure 11F:
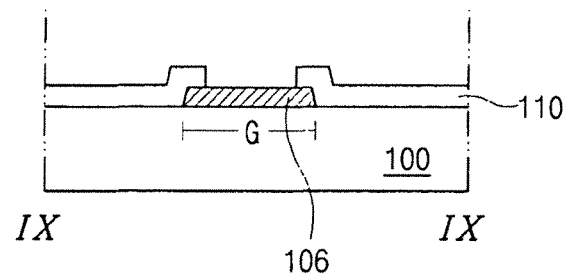
Figure 11G:
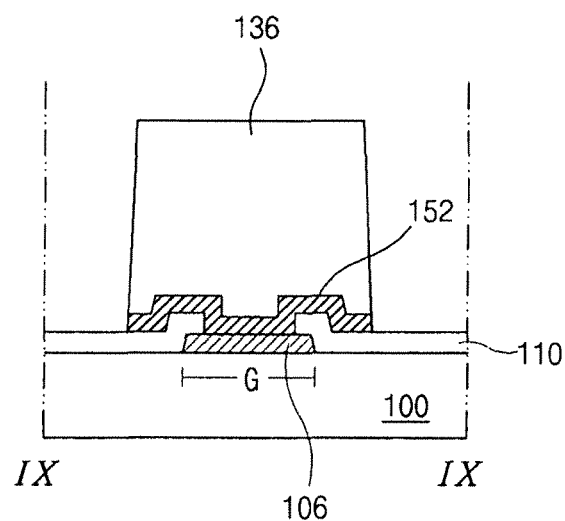
Figure 11H:
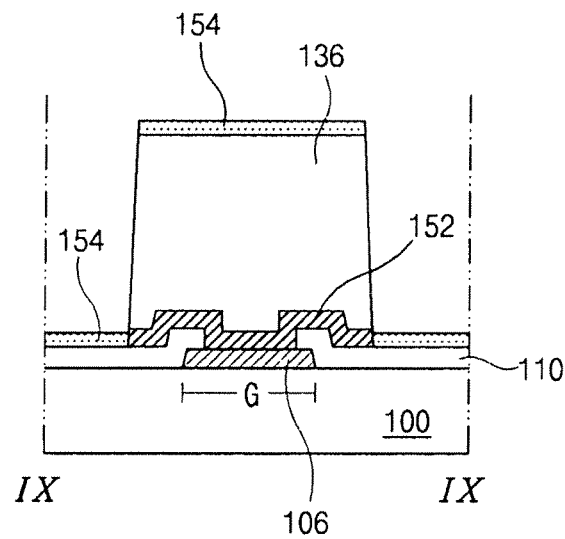
Figure 11I:
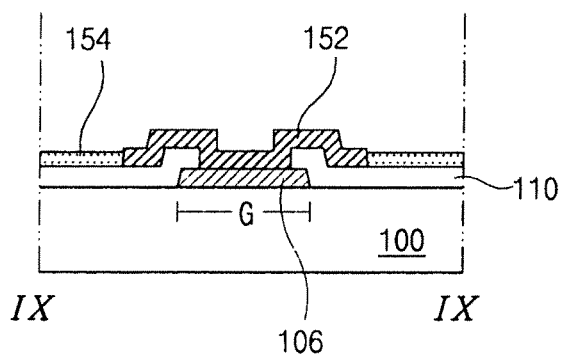
Figure 12A:
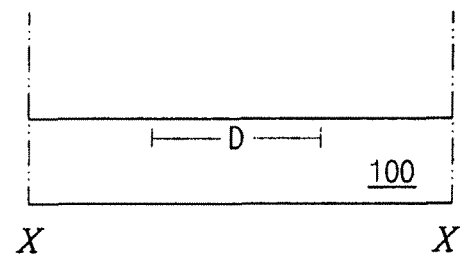
Figure 12B:
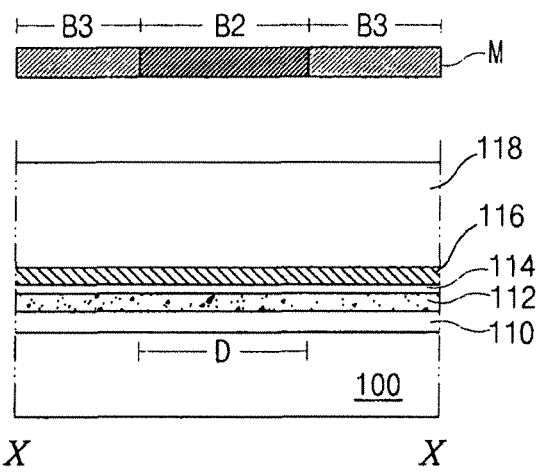
Figure 12C:
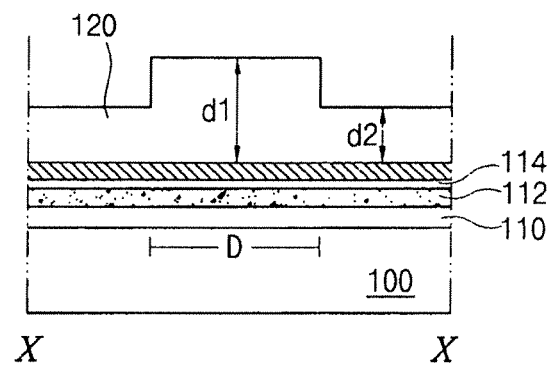
Figure 12D:
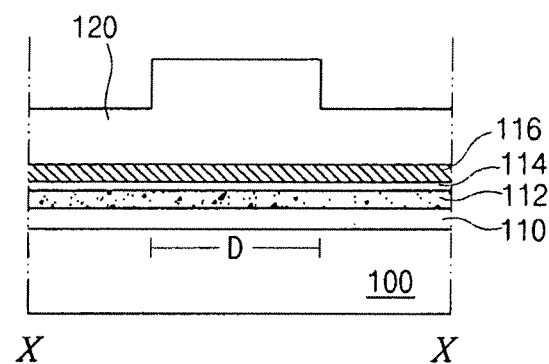
Figure 12E:
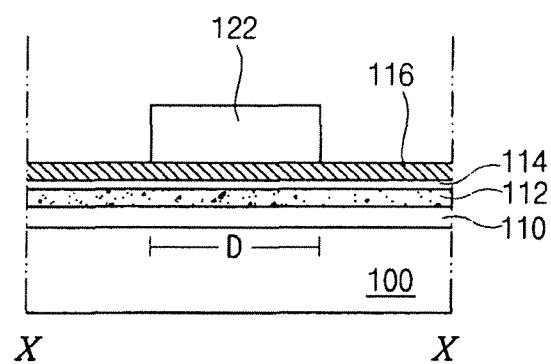
Figure 12F:
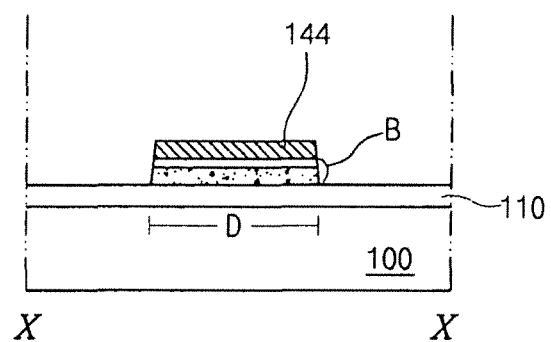
Figure 12G:
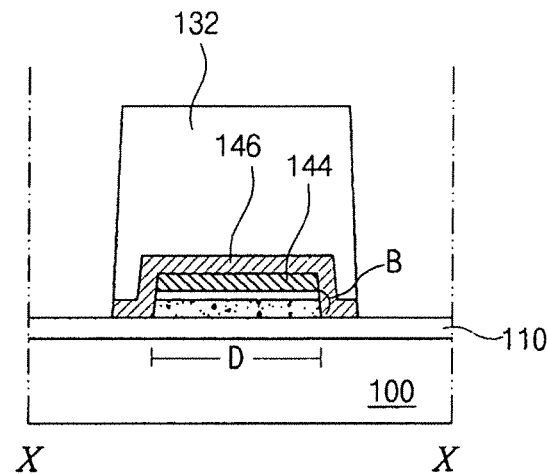
Figure 12H:
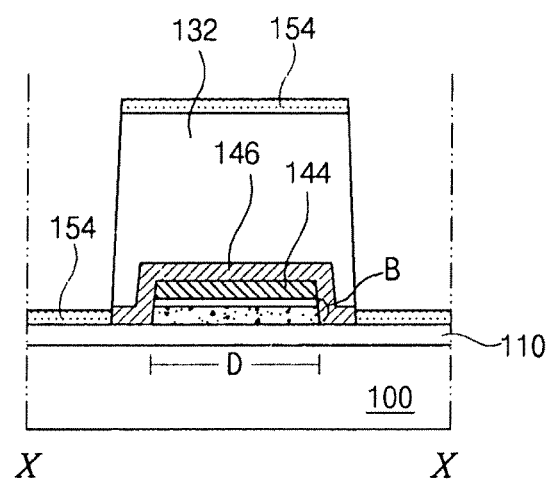
Figure 12I:
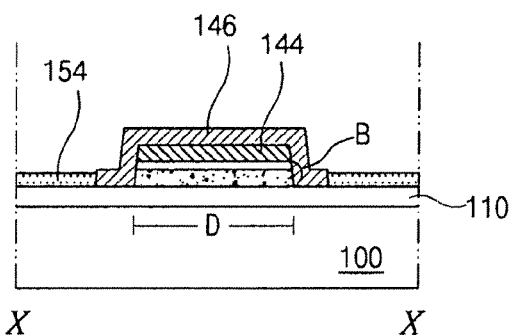
Figure 13A:
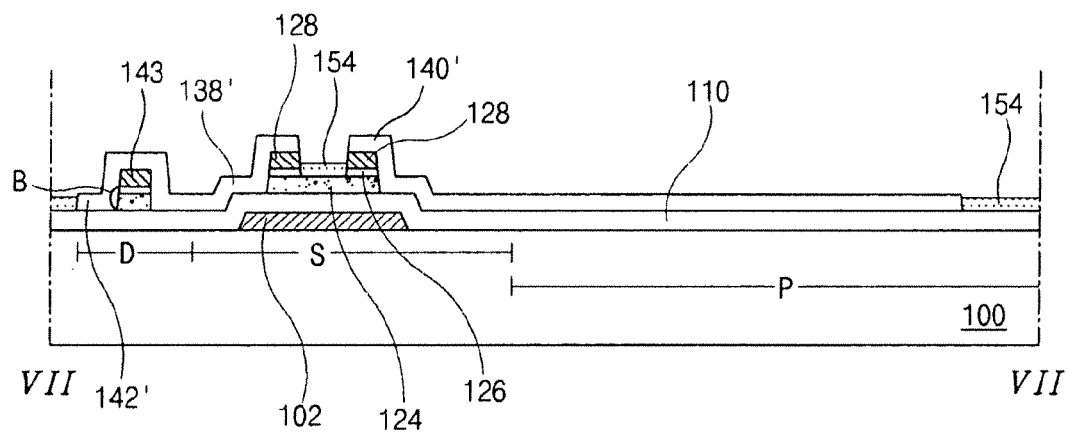
FIGS. 13A, 13B, 13C and 13D are cross-sectional views of an array substrate according to a second embodiment of the invention.
Figure 13B:
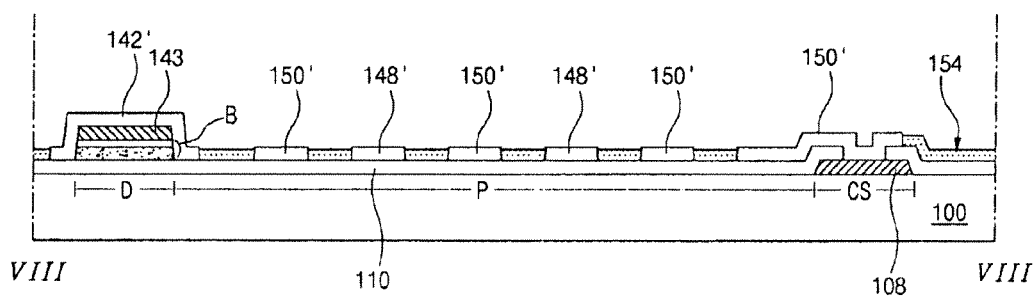
Figure 13C:
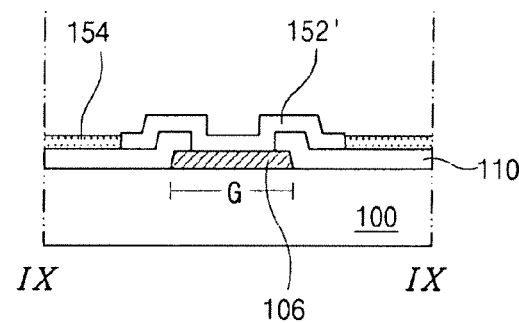
Figure 13D:
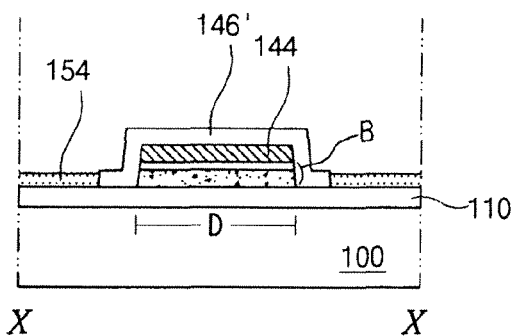

FIG. 7 is a plan view of an array substrate for an IPS mode LCD device according to a first embodiment of the present invention. FIGS. 8A to 8D are cross-sectional views of an array substrate for an IPS mode LCD device according to the first embodiment of the present invention. FIG. 8A corresponds to the line VII-VII of FIG. 7, FIG. 8B corresponds to the line VIII-VIII of FIG. 7, FIG. 8C corresponds to the line IX-IX of FIG. 7, and FIG. 8D corresponds to the line X-X of FIG. 7.

As shown in FIG. 7 and FIGS. 8A to 8D, a gate line 104 is formed on an insulating substrate 100 along a first direction, and a data line 143 is formed along a second direction. The gate line 104 and the data line 143 cross each other to define a pixel region P. A gate pad 106 is formed at one end of the gate line 104, and a data pad terminal 146 is formed at one end of a data cover line 142, which overlies the data line 143. A data pad 144 at the end of the data line 143. A common line 109 and a common electrode connecting part 108 are spaced apart from the gate line 104. The common line 109 and the common electrode connecting part 108 are parallel to the gate line 104 and are disposed at opposite sides of the pixel region P. A gate pad terminal 152 covers the gate pad 106.

A thin film transistor T is formed adjacent to where the gate line 104 crosses the data line 143. The thin film transistor T includes a gate electrode 102, a gate insulating layer 110 on the gate electrode 102, an active layer 124 on the gate insulating layer 110, ohmic contact layers 126 on the active layer 124, buffer metallic layers 128 on the contact layers, a source electrode 138, and a drain electrode 140 on the buffer metallic layers 128. The gate electrode 102 is connected to the gate line 104. The active layer 124 is an island shape formed over a gate electrode such that the source and drain ends of the active layer 124 do not extend beyond boundaries defined by the perimeter of the underlying gate electrode 102. The ohmic contact layers 126 and the buffer metallic layers 128 are sequentially disposed on the active layer 124. Each of the buffer metallic layers 128 contact the ohmic contact layers 126, which each respectively contact the source and drain electrodes 138 and 140. The source electrode 138 is connected to the data cover line 142, and the drain electrode 140 is spaced apart from the source electrode 138. A gate insulating layer 110 covers the gate line 104, the gate electrode 102 and the gate pad 106.

Here, the data line 143, the buffer metallic layers 128, the ohmic contact layers 126 and the active layer 124 are formed through the same mask process, and there is an extension part B under the data line 143 and the data pad 144. The extension part B includes patterns sequentially layered and respectively disposed on the same layers as the ohmic contact layers 126 and the active layer 124. Thus, the extension part B has the substantially same structure as the ohmic contact layers 126 and the active layer 124.

The buffer metallic layer 128, the data line 143 and the data pad 144 may have a multiple layer structure of at least three layers, for example, molybdenum-titanium (MoTi) alloy, copper (Cu) and MoTi alloy, are sequentially layered. The source and drain electrodes 138 and 140, the data cover line 142 and the data pad terminal 146 may be formed of MoTi alloy. The copper has relatively low resistivity, and signal delay due to resistance of a line is minimized when copper is used.

A pixel electrode 148 and a common electrode 150 are formed in the pixel region P. The pixel electrode 148 is electrically connected to the drain electrode 140, and the common electrode 150 is electrically connected to the common line 109. Each of the pixel electrode 148 and the common electrode 150 includes a plurality of patterns, which are parallel to the data line 143. The patterns of the pixel electrode 148 alternate with the patterns of the common electrode 150. The pixel electrode 148 extends from a pixel electrode connecting part 148a, which is connected to the drain electrode 138. The common electrode 150 contacts the common electrode connecting part 108. Although not shown in the figures, the common electrode connecting part 108 is connected to the common line 109 and provides signals from the common line 109 to the common electrode 150. Therefore, the common electrode 150 is electrically connected to a common electrode (not shown) in a pixel region adjacent thereto. Alternatively, the common electrode 150 may be directly connected to the common line 109. The pixel electrode connecting part 148a overlaps the common line 109 to thereby form a storage capacitor Cst. The pixel electrode 148 and the common electrode 150 are formed through the same process as the source and drain electrodes 138 and 140. The pixel electrode 148 and the common electrode 150 may be formed of a MoTi alloy.

A passivation layer 154 is formed on the active layer 124 exposed between the source and drain electrode 138 and 140 and on the gate insulating layer 110 exposed between the pixel electrode 148 and the common electrode 150. Thus, the passivation layer 154 is directly between the pixel electrode 148 and the common electrode 150. The passivation layer 154 surrounds the gate pad terminal 152 and the data pad terminal 146. The passivation layer 154 may be formed by deposition and liftoff processes without using an additional masking process. Since the active layer 124 is not exposed to light because the source and drain ends of the active layer do not extend beyond a boundary defined by the underlying gate electrode, the wavy noise or incorrect operation of the thin film transistor due to leakage currents is prevented.

A method of manufacturing the array substrate according to the first embodiment will be explained hereinafter with reference to FIGS. 9A to 9I, FIGS. 10A to 10I, FIGS. 11A to 11I, and FIGS. 12A to 12I. FIGS. 9A to 9I are cross-sectional views along the line VII-VII of FIG. 7. FIGS. 10A to 10I are cross-sectional views along the line VIII-VIII of FIG. 7. FIGS. 11A to 11I are cross-sectional views along the line IX-IX of FIG. 7. FIGS. 12A to 12I are cross-sectional views along the line X-X of FIG. 7.

FIG. 9A, FIG. 10A, FIG. 11A and FIG. 12A show a first mask process. In FIG. 9A, FIG. 10A, FIG. 11A and FIG. 12A, a switching region S, a pixel region P, a gate region G, a data region D, and a common signal region CS are defined on a substrate 100. A first conductive metallic layer (not shown) is formed on the substrate 100, where the regions S, P, G, D and CS are defined, by depositing a conductive metal consisting of one or more material from a conductive metallic group including aluminum (Al), aluminum alloy (AlNd), chromium (Cr), molybdenum (Mo), tungsten (W), titanium (Ti), copper (Cu), and tantalum (Ta). The first conductive metallic layer is patterned through a first mask process to thereby form a gate electrode 102, a gate line 104 of FIG. 7, and a gate pad 106. The gate electrode 102 is disposed in the switching region S, and the gate line 104 and the gate pad 106 are disposed in the gate region G. The gate pad 106 is formed at one end of the gate line 104. Simultaneously, a common line 109 of FIG. 7 and a common electrode connecting part 108 are formed on the substrate 100. The common line 109 and the common electrode connecting part 108 are parallel to the gate line 104 and disposed at opposite sides of the pixel region P.

FIGS. 9B to 9F, FIGS. 10B to 10F, FIGS. 11B to 11F, and FIGS. 12B to 12F show a second mask process. As shown in FIG. 9B, FIG. 10B, FIG. 11B and FIG. 12B, a gate insulating layer 110, an intrinsic amorphous silicon layer (a-Si:H) 112, an impurity-doped amorphous silicon layer (for example, n+ a-Si:H) 114, and a second conductive metallic layer 116 are sequentially formed over a surface of the substrate 100, including the gate electrode 102, the gate line 104 of FIG. 7, the gate pad 106, the common line 109 of FIG. 7 and the common electrode connecting part 108. A photoresist layer 118 is formed on the second conductive metallic layer 116 by coating the substrate 100 with photoresist.

The gate insulating layer 110 may be formed by depositing an inorganic insulating material consisting of one or more material from an inorganic insulating material group, including silicon nitride ($SiN_x$) and silicon oxide ($SiO_2$). The second conductive metallic layer 116 may have a multiple layer structure. For example, the second conductive metallic layer 116 may include a first layer of MoTi alloy, a second layer of copper (Cu), and a third layer of MoTi alloy. The copper has relatively low resistivity, and a copper line can minimize signal delay. By the way, the copper easily reacts with silicon or oxide, and thus resistance of the line increases. To prevent this, the MoTi alloy layers are formed under and on the copper layer, respectively.

A mask M is disposed over the photoresist layer 118. The mask M is one of a half-tone mask and a diffraction mask. The mask M includes a light-transmitting portion B1, a light-blocking portion B2, and a light-half transmitting portion B3. The light-blocking portion B2 corresponds to the switching region S and the data region D. The light-transmitting portion B1 corresponds to the gate region G for the gate pad 106 and the common signal region CS. The light-half transmitting portion B3 corresponds to other regions except for the switching region S, the data region D, the gate region G for the gate pad 106, and the common signal region CS. The size of the light-blocking portion B2 corresponding to the switching region S is not larger than the gate electrode 102. Next, the photoresist layer 118 is exposed to light through the mask M and then is developed.

Referring to FIG. 9C, FIG. 10C, FIG. 11C and FIG. 12C, a photoresist pattern 120 is formed after developing the photoresist layer 118 of FIG. 9B, FIG. 10B, FIG. 11B and FIG. 12B. The photoresist pattern 120 has a first part of a first thickness d1 and a second part of a second thickness d2. The first part is disposed in the switching region S and the data region D. The second part is disposed in other regions except for the switching region S, the data region D, the gate region G for the gate pad 106, and the common signal region CS. The photoresist pattern 120 is removed in the gate region G for the gate pad 106 and the common signal region CS to expose the second conductive metallic layer 116. The first thickness d1 is substantially the same as the original thickness of the photoresist layer 118 of FIG. 9B, FIG. 10B, FIG. 11B and FIG. 12B. The second thickness d2 is thinner than the first thickness d1.

As shown in FIG. 9D, FIG. 10D, FIG. 11D and FIG. 12D, the exposed second conductive metallic layer 116, the impurity-doped amorphous silicon layer 114, the intrinsic amorphous silicon layer 112, and the gate insulating layer 110 are removed in the gate region G for the gate pad 106 and the common signal region CS to expose the gate pad 106 and the common electrode connecting part 108. Next, an ashing process is performed to remove the second part of the photoresist pattern 120. The first part of the photoresist pattern 120 is also partially removed.

As shown in FIG. 9E, FIG. 10E, FIG. 11E and FIG. 12E, a photoresist pattern 122 remains in the switching region S and the data region D. The photoresist pattern 122 has a thinner thickness than the first part of the photoresist pattern 120 of FIG. 9D and FIG. 10D. The second conductive metallic layer 116 is exposed in the other regions except for the data region D and a portion of the switching region S while the gate pad 106 and the common electrode connecting part 108 remain partially exposed. The second conductive metallic layer 116, the impurity-doped amorphous silicon layer 114, and the intrinsic amorphous silicon layer 112 are removed by using the photoresist pattern 122 as an etching mask. Next, the photoresist pattern 122 is removed.

As shown in FIG. 9F, FIG. 10F, FIG. 11F and FIG. 12F, an active layer 124, an ohmic contact layer 126, and a buffer metallic layer 128 are sequentially formed in the switching region S so that source and drain ends of the active layer 124 do not extend beyond a boundary defined by a perimeter of the underlying gate electrode 102. A data line 143 is formed in the data region D. A data pad 144 is disposed at one end of the data line 143. An extension part B is formed under the data line 143 and the data pad 144. The extension part B includes patterns disposed on the same as the active layer 124 and the ohmic contact layer 126, respectively. That is, the extension part B includes an intrinsic amorphous silicon pattern and an impurity-doped amorphous silicon pattern.

FIGS. 9G to 9H, FIGS. 10G to 10H, FIGS. 11G to 11H and FIGS. 12G to 12H show a third mask process. As shown in FIG. 9G, FIG. 10G, FIG. 11G and FIG. 12G, a third conductive metallic layer (not shown) and a photoresist layer (not shown) are formed substantially over an entire surface of the substrate 100, including the active layer 124, the ohmic contact layer 126, the buffer metallic layer 128, and the data line 143. The third conductive metallic layer can be formed of MoTi alloy. The photoresist layer is exposed to light and developed through a third mask process to thereby form a first photoresist pattern 130, a second photoresist pattern 132, a third photoresist pattern 134 and a fourth photoresist pattern 136. The first photoresist pattern 130 is disposed in the switching region S and includes two parts spaced apart from each other. The second photoresist pattern 132 is disposed in the data region D and is connected to the part of the first photoresist pattern 130. The third photoresist pattern 134 is disposed in the pixel region P and includes first portions and second portions alternating with one another. The fourth photoresist pattern 136 is disposed over the gate pad 106.

The third conductive metallic layer is removed by using the first, second, third, and fourth photoresist patterns 130, 132, 134 and 136 as an etching mask. A source electrode 138, a drain electrode 140, a data cover line 142, a data pad terminal 146, a pixel electrode 148, a common electrode 150 and a gate pad terminal 152 are formed. At this time, a pixel electrode connecting part 148a of FIG. 7 is also formed. The source electrode 138 and the drain electrode 140 are formed using the first photoresist pattern 130. The data cover line 142 and the data pad terminal 146 are formed using the second photoresist pattern 132. The data pad terminal 146 is disposed at one end of the data cover line 142. The data cover line 142 and the data pad terminal 146 cover the extension part B. The pixel electrode connecting part 148a, the pixel electrode 148 and the common electrode 150 are formed using the third photoresist pattern 134. The pixel electrode connecting part 148a contacts the drain electrode 140, and the pixel electrode 148 extends from the pixel electrode connecting part 148a. The common electrode 150 contacts the common electrode connecting part 108. Each of the pixel electrode 148 and the common electrode 150 includes a plurality patterns, and the patterns of the pixel electrode 148 alternate with the patterns of the common electrode 150. The gate pad terminal 152 is formed using the fourth photoresist pattern 136 and is connected to the gate pad 106.

Next, the buffer metallic layer 128 and the ohmic contact layer 126 between the parts of the first photoresist pattern 130, which is, between the source and drain electrodes 138 and 140, are removed to thereby expose the active layer 124. The active layer 124 and the ohmic contact layers 126 are disposed over and within a boundary defined by a perimeter of the gate electrode 102 so as to be shielded by the gate electrode 102. The data cover line 142 covers the extension part B, including patterns formed at the same time as the active layer 124 and the ohmic contact layer 126. Accordingly, the active layer 124 is not exposed to light. Since there is no photocurrent in the active layer 124 due to light, the thin film transistor works correctly, and the wavy noise does not occur on displayed images.

In FIG. 9H, FIG. 10H, FIG. 11H and FIG. 12H, a passivation layer 154 is formed substantially over an entire surface of the substrate 100 including the first, second, third and fourth photoresist patterns 130, 132, 134 and 136 by depositing an inorganic insulating material consisting of one or more material from an inorganic insulating material group, including silicon nitride ($SiN_x$) and silicon oxide ($SiO_2$). The passivation layer 154 includes portions on the first, second, third and fourth photoresist patterns 130, 132, 134 and 136, on the exposed active layer 124, and on the gate insulating layer 110 between the pixel electrode 148 and the common electrode 150. Next, the first, second, third and fourth photoresist patterns 130, 132, 134 and 136 are removed by a liftoff method.

As shown in FIG. 9I, FIG. 10I, FIG. 11I and FIG. 12I, the passivation layer 154 covers the active layer 124 directly between the source and drain electrodes 138 and 140 and the gate insulating layer 110 between the pixel electrode 148 and the common electrode 150. The passivation layer 154 exposes the gate pad terminal 152 and the data pad terminal 146.

The third conductive metallic layer, as shown in FIG. 9G, FIG. 10G, FIG. 11G and FIG. 12G, is removed such that it is over-etched under the first, second, third and fourth photoresist patterns 130, 132, 134 and 136 by using wet-etching, which is isotropic. Therefore, lower surfaces of the first, second, third and fourth photoresist patterns 130, 132, 134 and 136 are partially exposed at peripheries thereof. The exposed lower surfaces of the first, second, third and fourth photoresist patterns 130, 132, 134 and 136 make it possible for stripper to easily permeates the first, second, third and fourth photoresist patterns 130, 132, 134 and 136 so as to remove the first, second, third and fourth photoresist patterns 130, 132, 134 and 136 thoroughly during the liftoff process. Thus, it is desirable to expose lower surfaces at peripheries of the first, second, third and fourth photoresist patterns 130, 132, 134 and 136 so that each has a width within a range of about 2,000 to 5,000 Å. Like this, the array substrate for an IPS mode LCD device may be manufactured through 3 mask processes including the liftoff process according to the invention.

In the first embodiment, the common electrode 150 and the pixel electrode 148 are formed of an opaque metallic material. In a second embodiment of the invention, the common electrode and the pixel electrode are formed of a transparent conductive material. The second embodiment will be describe with reference to FIGS. 13A to 13D.

FIGS. 13A, 13B, 13C and 13D are cross-sectional views along the line VII-VII, VIII-VIII, IX-IX and X-X of FIG. 7. As shown in FIGS. 13A, 13B, 13C and 13D, a switching region S, a pixel region P, a gate region G, a data region D, and a common signal region CS are defined on a substrate 100. A thin film transistor is formed in the switching region S on the substrate 100. The thin film transistor includes a gate electrode 102, a gate insulating layer 110 on the gate electrode 102, an active layer 124 on the gate insulating layer 110, ohmic contact layers 126 on the active layer 124, buffer metallic layers 128 on the ohmic contact layers 126, a transparent source electrode 138' and a transparent drain electrode 140'. The active layer 124 is an island shape formed over a gate electrode such that the source and drain ends of the active layer 124 do not extend beyond a boundary defined by the perimeter of the underlying gate electrode 102. The transparent source and drain electrodes 138' and 140' contact the buffer metallic layers 128.

A pixel electrode 148' and a common electrode 150' are formed in the pixel region P on the substrate 100. Each of the pixel electrode 148' and the common electrode 150' includes a plurality of patterns, and the patterns of the pixel electrode 148' alternate with the patterns of the common electrode 150'. The pixel electrode 148' is electrically connected to the drain electrode 140'. The pixel electrode 148' and the common electrode 150' are transparent.

The data region D is disposed at a side of the pixel region P. An extension part B, a data line 143, a data pad 144, a transparent data cover line 142' and a transparent data pad terminal 146' are formed in the data region D. The extension part B includes patterns disposed on the same layers as the ohmic contact layers 126 and the active layer 124, respectively. The data pad terminal 146' is disposed at one end of the data cover line 142'.

The gate region G and the common signal region CS are disposed at opposite sides of the pixel region P and meet the data region D. A gate line 104 of FIG. 7 and a gate pad 106 are formed in the gate region G. The gate pad 106 is disposed at one end of the gate line. A gate pad terminal 152' covers the gate pad 106 and is transparent. A common electrode connecting part 108 is formed in the common signal region CS. The common electrode connecting part 108 is connected to the common electrode 150'.

The buffer metallic layer 128 may include three layers of MoTi alloy, copper (Cu) and MoTi alloy. Even though the source and drain electrodes 138' and 140' and the data cover line 142' are formed of a transparent conductive material, which has relatively high resistivity, there is no signal delay due to the buffer metallic layers 128.

In the second embodiment, the pixel electrode 148' and the common electrode 150' are transparent, and thus the brightness of the device increases. In addition, since the drain electrode 140' is transparent, light emitted from a backlight passes through the transparent drain electrode 140'. Accordingly, there is no light reflected by the drain electrode 140' that goes into the active layer 124.

The array substrate according to the second embodiment may be manufactured through the same processes as the first embodiment except for the third conductive metallic layer is formed of a transparent conductive material, such as ITO or IZO.

Figure 14A:
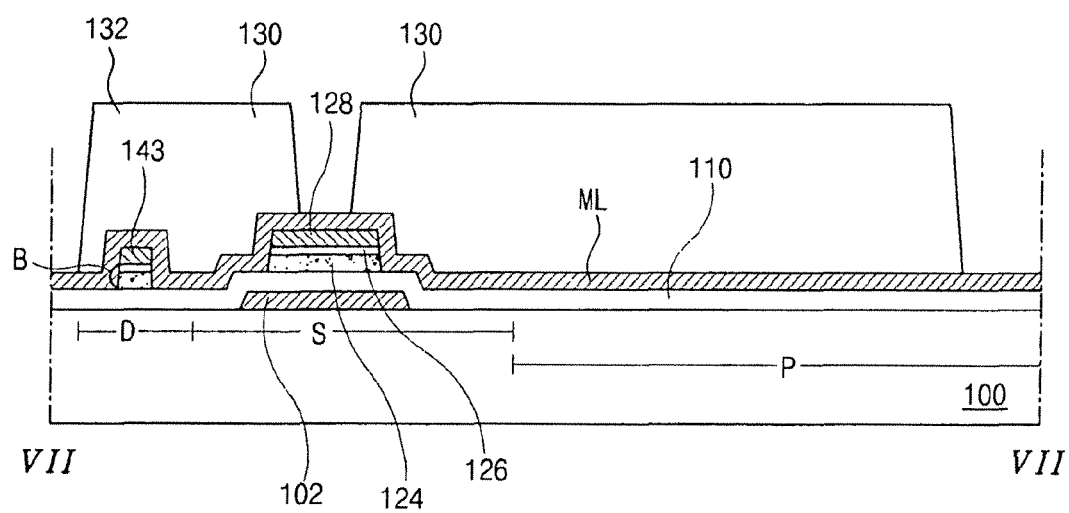
FIGS. 14A to 14C, FIGS. 15A to 15C, FIGS. 16A to 16C and FIGS. 17A to 17C are cross-sectional views illustrating a method of manufacturing an array substrate according to a third embodiment of the invention.
Figure 14B:
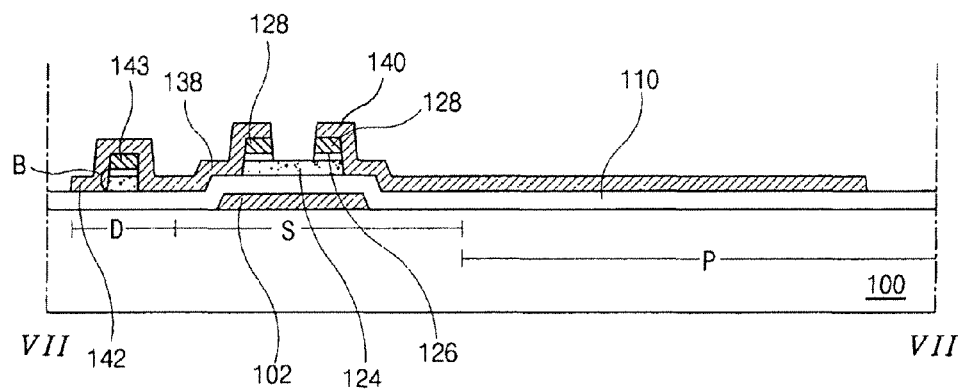
Figure 14C:
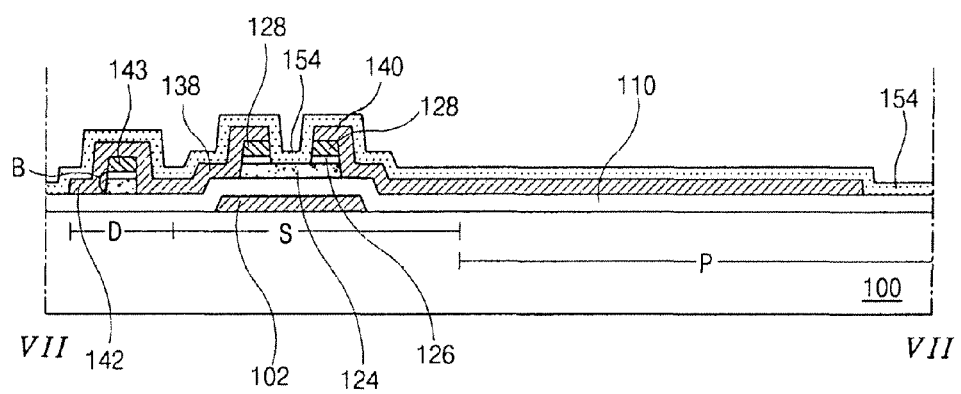
Figure 15A:
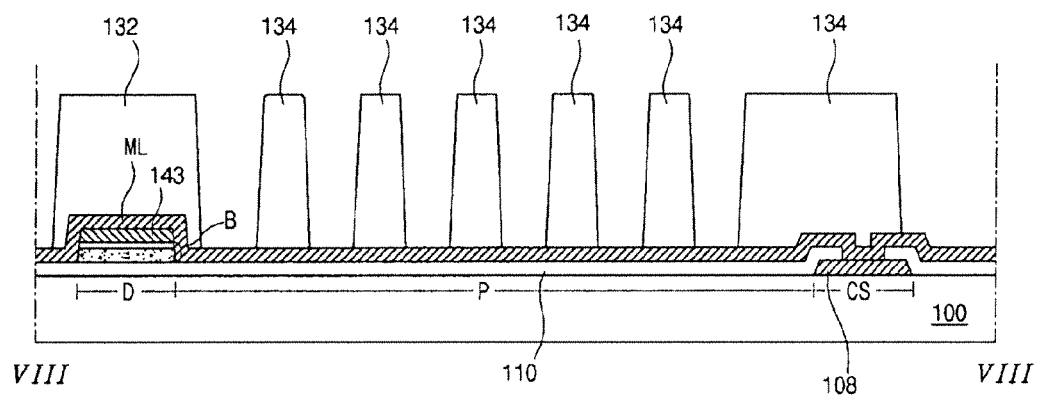
Figure 15B:
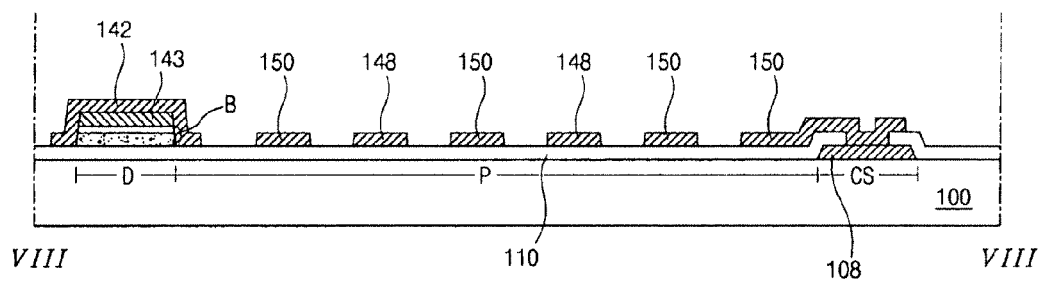
Figure 15C:
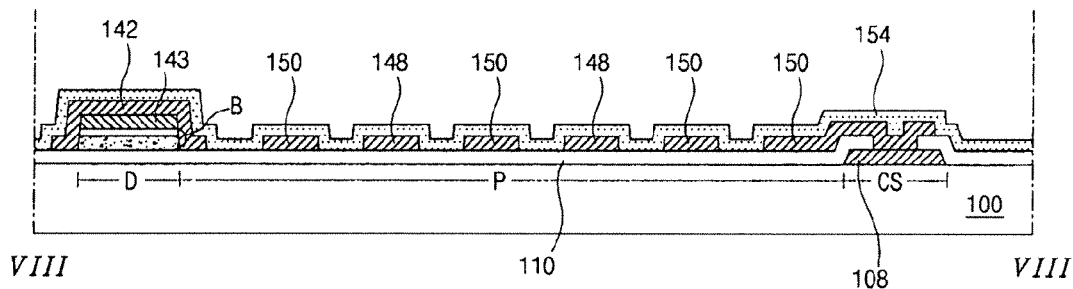
Figure 16A:
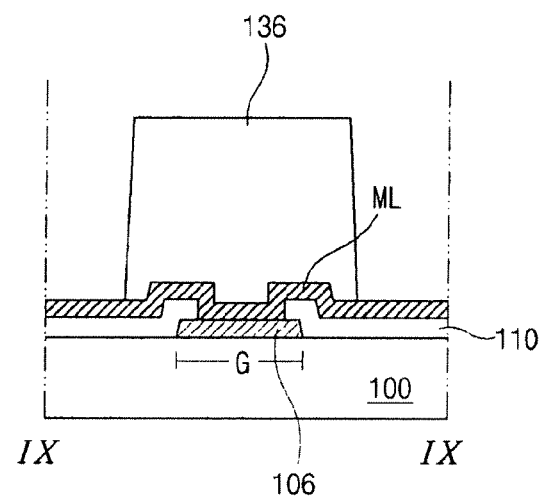
Figure 16B:
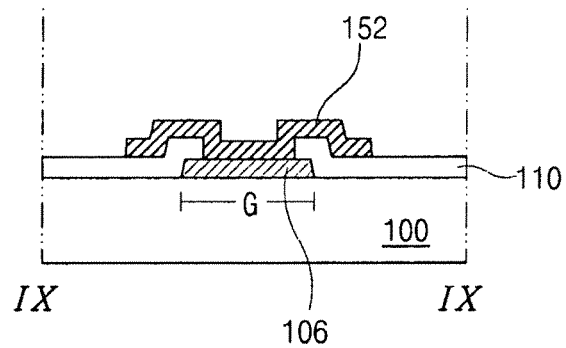
Figure 16C:
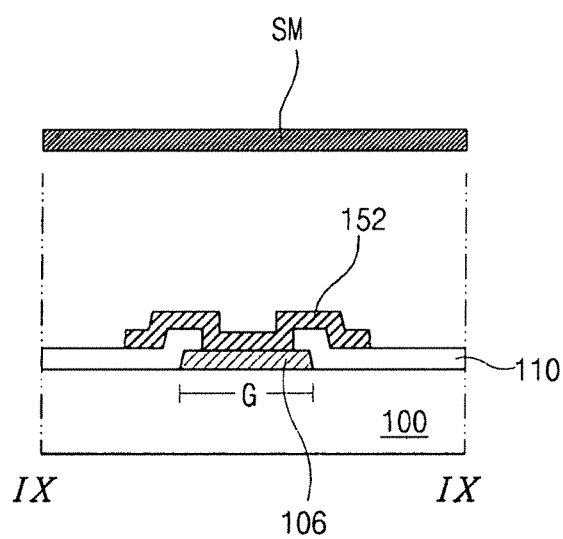
Figure 17A:
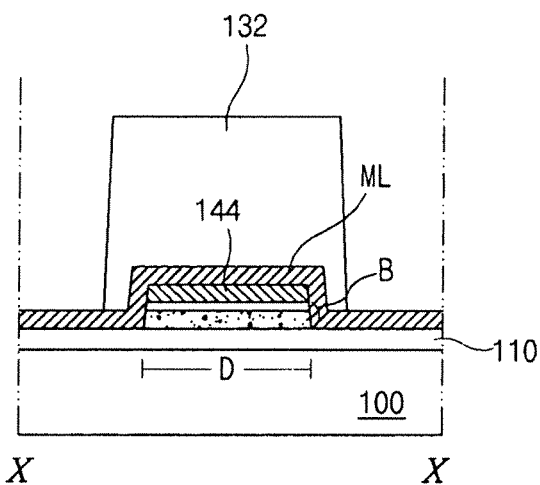
Figure 17B:
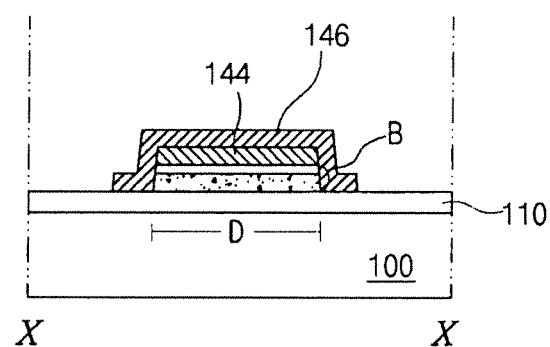
Figure 17C:
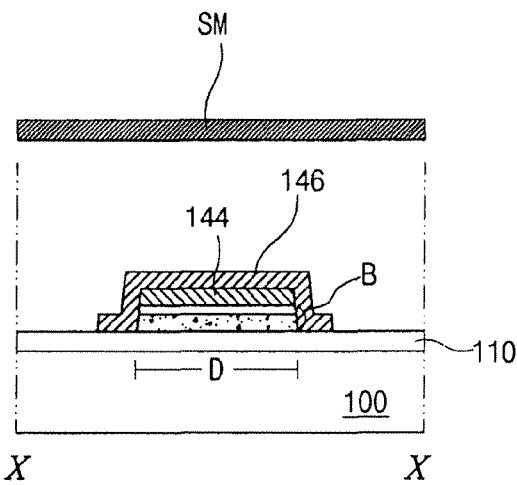

In the first and second embodiments, the passivation layer is formed by a liftoff method. In a third embodiment of the invention, the passivation layer is formed by using a shadow mask. A method of manufacturing an array substrate according to the third embodiment will be described hereinafter with reference to FIGS. 14A to 14C, FIGS. 15A to 15C, FIGS. 16A to 16C and FIGS. 17A to 17C. First and second mask processes of the third embodiment are the same as the first and second embodiments. FIGS. 14A to 14C, FIGS. 15A to 15C, FIGS. 16A to 16C and FIGS. 17A to 17C show a third mask process in the third embodiment of the invention. FIGS. 14A to 14C are cross-sectional views along the line VII-VII of FIG. 7. FIGS. 15A to 15C are cross-sectional views along the line VIII-VIII of FIG. 7. FIGS. 16A to 16C are cross-sectional views along the line IX-IX of FIG. 7. FIGS. 17A to 17C are cross-sectional views along the line X-X of FIG. 7.

In FIG. 14A, FIG. 15A, FIG. 16A and FIG. 17A, a switching region S, a pixel region P, a gate region G, a data region D, and a common signal region CS are defined on a substrate 100. A gate electrode 102, a gate line 104 of FIG. 7 and a gate pad 106 are formed on the substrate 100 through a first mask process. Simultaneously, a common line 109 of FIG. 7 and a common electrode connecting part 108 are formed on the substrate 100. The gate electrode 102 is disposed in the switching region S. The gate line 104 and the gate pad 106 are disposed in the gate region G, and the gate pad 106 is disposed at one end of the gate line 104. The gate line 104 is connected to the gate electrode 102. The common line 109 and the common electrode connecting part 108 are parallel to the gate line 104.

A gate insulating layer 110 is formed over the entire surface of the substrate 100, including the gate electrode 102, the gate line 104, the gate pad 106, the common line 109 and the common electrode connecting part 108. The gate pad 106 and the common electrode connecting part 108 are partially exposed, and an active layer 124, the ohmic contact layer 126 and a buffer metallic layer 128 are formed on the gate insulating layer 110 through a second mask process. An extension part B, a data line 143 and a data pad 144 are also formed through the second mask process. The extension part B includes patterns disposed on the same layers as the ohmic contact layer 126 and the active layer 110, respectively. The extension part B is disposed under the data line 143 and the data pad 144.

A third conductive metallic layer ML and a photoresist layer (not shown) are formed over an entire surface of the substrate 100, including the active layer 124, the ohmic contact layer 126, the data line 143 and the buffer metallic layer 128. The photoresist layer is exposed to light and developed through a third mask process to thereby form a first photoresist pattern 130, a second photoresist pattern 132, a third photoresist pattern 134 and a fourth photoresist pattern 136. The first photoresist pattern 130 is disposed in the switching region S and includes two parts spaced apart from each other. The second photoresist pattern 132 is disposed in the data region D and is connected to the part of the first photoresist pattern 130. The third photoresist pattern 134 is disposed in the pixel region P and includes first portions and second portions alternating with one another. The fourth photoresist pattern 136 is disposed over the gate pad 106.

The third conductive metallic layer ML is removed by using the first, second, third, and fourth photoresist patterns 130, 132, 134 and 136 as an etching mask, and then the first, second, third and fourth photoresist patterns 130, 132, 134 and 136 are removed. The third conductive metallic layer ML may be formed of MoTi alloy or a transparent conductive material, such as ITO or IZO.

In FIG. 14B, FIG. 15B, FIG. 16B and FIG. 17B, a source electrode 138, a drain electrode 140, a data cover line 142, a data pad terminal 146, a pixel electrode 148, a common electrode 150 and a gate pad terminal 152 are formed. At this time, a pixel electrode connecting part 148a of FIG. 7 is also formed. The source electrode 138 and the drain electrode 140 are disposed in the switching region S and are spaced apart from each other. The data cover line 142 and the data pad terminal 146 are disposed in the data region D, and the data pad terminal 146 is disposed at one end of the data cover line 142. The data cover line 142 and the data pad terminal 146 cover the extension part B. The pixel electrode 148 and the common electrode 150 are disposed in the pixel region P. The pixel electrode 148 is electrically connected to the drain electrode 140. The common electrode 150 contacts the common electrode connecting part 108. Each of the pixel electrode 148 and the common electrode 150 includes a plurality patterns, and the patterns of the pixel electrode 148 alternate with the patterns of the common electrode 150. The gate pad terminal 152 contacts the gate pad 106.

Next, the buffer metallic layer 128 and the ohmic contact layer 126 between the source and drain electrodes 138 and 140 are removed to thereby expose the active layer 124. The buffer metallic layer 128 and the ohmic contact layer 126 may be removed by using the first photoresist pattern 130 as an etching mask.

As shown in FIG. 14C, FIG. 15C, FIG. 16C and FIG. 17C, a shadow mask SM is disposed over the gate pad terminal 152 and the data pad terminal 146, and then a passivation layer 154 is formed substantially over an entire surface of the substrate 100 by depositing an inorganic insulating material consisting of one or more material from an inorganic insulating material group including silicon nitride ($SiN_x$) and silicon oxide ($SiO_2$). The passivation layer 154 exposes the gate pad terminal 152 and the data pad terminal 146.

Figure 18:
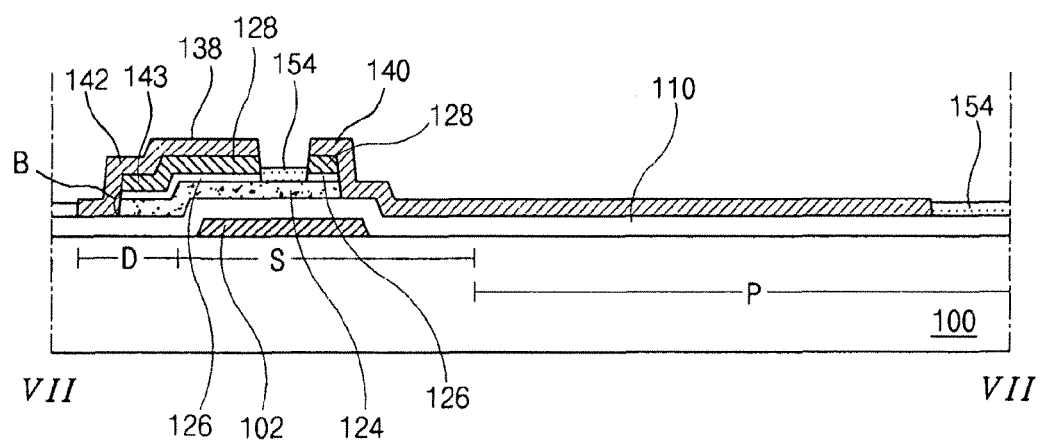
FIG. 18 is a cross-sectional view illustrating an array substrate according to another embodiment of the invention

In the third embodiment, by using the shadow mask, the passivation layer 154 is formed in almost all areas, excluding the gate pad terminal 152 and the data pad terminal 146 without an additional mask process. In the first to third embodiments, while the patterns of the extension part B are disconnected to the ohmic contact layer 126 and the active layer 124, the patterns of the extension part B may be connected to them. Another embodiment of the invention having such a structure is illustrated in FIG. 18. FIG. 18 is a cross-sectional view illustrating an array substrate according to another embodiment of the invention. The structure of FIG. 18 is the same as the first to third embodiments except for the patterns of the extension part connected to the ohmic contact layer and the active layer. As shown in FIG. 18, the same parts as the first to third embodiments have the same references, and explanations for the parts will be omitted.

In FIG. 18, the data line 143 and the extension part B are disposed in the data region D. The data line 143 is connected to one of the buffer metallic layers 128. The extension part B has the substantially same structure as the active layer 124 and the ohmic contact layer 126. That is, the extension part B includes an intrinsic amorphous silicon pattern and an impurity-doped amorphous silicon pattern, which are formed of the same materials and on the same layers as the active layer 124 and the ohmic contact layer 126, respectively. The intrinsic amorphous silicon pattern of the extension part B is connected to the active layer 124, and the impurity-doped amorphous silicon pattern of the extension part B is connected to one of the ohmic contact layers 126. The data cover line 142 covers the extension part B, and the source electrode 138 extends from the data cover line 142.

The array substrate of FIG. 18 may be formed through the same processes as the first to third embodiments. In this way, the array substrate for an IPS mode LCD device may be manufactured using 3 mask processes according to embodiments of the invention. That is, the gate electrode, the gate line, the gate pad, the common line and the common electrode connecting part are formed using the first mask process. The gate insulating layer, the active layer, the ohmic contact layer, the buffer metallic layer, the data line, and the data pad are formed over the gate electrode using the second mask process, and the gate pad and the common electrode connecting part are exposed via the gate insulating layer at this time. The source and drain electrodes, the pixel electrode, the common electrode, the gate pad terminal, the data cover line, and the data pad terminal are formed using the third mask process. The passivation layer is formed, and the gate pad terminal and the data pad terminal are exposed via the passivation layer using the liftoff process or the shadow mask.

In embodiments of the present invention, the active layer is disposed over and within the gate electrode, and light from the backlight is prevented from going into the active layer. Accordingly, a photo-leakage current is not generated, and the thin film transistor operates properly. High quality images can be displayed. In addition, since the intrinsic amorphous silicon layer is not exposed beyond the data line, the wavy noise does not occur. The aperture ratio increases, and the brightness of the device is improved. Furthermore, the array substrate may be manufactured using three mask processes. The manufacturing costs and time decrease, and the production yield increases. Moreover, copper is used as a material for the lines such that signal delay is prevented.

It will be apparent to those skilled in the art that various modifications and variations can be made in the array substrate for an in-plane switching mode liquid crystal display device and a method of manufacturing the same of the present invention without departing from the spirit or scope of the invention. Thus, it is intended that the present invention cover the modifications and variations of this invention provided they come within the scope of the appended claims and their equivalents.

What is claimed is:

1. A method of manufacturing a liquid crystal display device with a substrate having a switching region, a pixel region, and a data region and common signal region defined thereon, comprising:
    forming a gate line with a gate electrode in the switch region and a common line in the common signal region;
    forming a gate insulating layer, an active layer, an ohmic contact layer in at least a portion of the switching region together with just the gate insulating layer in the pixel region;
    forming source and drain electrodes over ohmic contact layers by creating an opening to the active layer between the source and drain electrodes;
    forming a data line electrically connected to the source electrode and crossing the gate line;
    forming a pixel electrode electrically connected to the drain electrode and a common electrode spaced apart from the pixel electrode; and
    forming a passivation layer on the gate insulating layer between the pixel electrode and the common electrode and on the active layer between the source and drain electrodes,
        wherein the passivation layer is formed in a lift off process and exposes the source electrode, and
        wherein the source electrode, drain electrode, common electrode, pixel electrode and a data cover line are formed in the same masking process.

2. The method of manufacturing a liquid crystal display device with a substrate according to claim 1, wherein the forming a gate insulating layer, an active layer, an ohmic contact layer in at least a portion of the switching region together with just the gate insulating layer in the pixel region and the forming a data line use a single mask.

3. The method of manufacturing a liquid crystal display device with a substrate according to claim 1, wherein the forming a gate insulating layer, an active layer, an ohmic contact layer in at least a portion of the switching region together with just the gate insulating layer in the pixel region includes forming a buffer metallic layer on the ohmic contact layer.

4. A method of manufacturing an array substrate for a liquid crystal display device, comprising:
    forming a gate electrode and a gate line on a substrate through a first mask process;
    forming a gate insulating layer, an active layer, an ohmic contact layer and a data line sequentially disposed on the substrate including the gate electrode and the gate line through a second mask process; and
    forming a source electrode, a drain electrode, a common electrode, a pixel electrode and a passivation layer on the substrate through a third mask process,
        wherein the passivation layer is disposed between the common electrode and the pixel electrode and on the active layer between source and drain electrodes.

5. The method according to claim 4, wherein the first mask process further includes forming a gate pad at one end of the gate line, the second mask process further includes forming a data pad at one end of the data line, and the third mask process further includes forming a data cover line on the data line, a gate pad terminal on the gate pad, and a data pad terminal on the data pad.

6. The method according to claim 5, wherein the second mask process includes:
- sequentially forming the gate insulating layer, an intrinsic amorphous silicon layer, an impurity-doped amorphous silicon layer and a metallic layer on the substrate including the gate electrode, the gate line and the gate pad;
- forming a photoresist pattern on the metallic layer, the photoresist pattern exposing the metallic layer corresponding to the gate pad, the photoresist pattern including a first part corresponding to the active layer, the data line and the data pad and a second part corresponding to other areas except the active layer, the data line, the data pad and the gate pad, the first part being thicker than the second part;
- exposing the gate pad by removing the exposed metallic layer, the impurity-doped amorphous silicon layer, the intrinsic amorphous silicon layer and the gate insulating layer;
- removing the second part of the photoresist pattern;
- removing the metallic layer, the impurity-doped amorphous silicon layer and the intrinsic amorphous silicon layer by using the first part of the photoresist pattern as an etching mask; and
- removing the first part of the photoresist pattern.

7. The method according to claim 6, wherein forming the photoresist pattern uses a mask including a light-transmitting portion, a light-blocking portion and a light-half transmitting portion, the light-transmitting portion corresponding to the gate pad, the light-blocking portion corresponding to the active layer, the data line and the data pad, the light-half transmitting portion corresponding to the other areas except the active layer, the data line, the data pad and the gate pad.

8. The method according to claim 7, wherein the second mask process further includes forming an extension part under the data cover line and the data pad terminal, wherein the extension part includes an intrinsic amorphous silicon pattern and an impurity-doped amorphous silicon pattern.

9. The method according to claim 6, wherein the first mask process further includes forming a common line parallel to the gate line, wherein the common electrode is electrically connected to the common line.

10. The method according to claim 9, wherein the second mask process further includes exposing the common line by removing the exposed metallic layer, the impurity-doped amorphous silicon layer, the intrinsic amorphous silicon layer and the gate insulating layer.

11. The method according to claim 5, wherein the third mask process includes:
- forming a conductive layer on the substrate including the data line and the data pad;
- forming first, second, third, and fourth photoresist patterns on the conductive layer, the first photoresist pattern corresponding to the source and drain electrodes, the second photoresist pattern corresponding to the data cover line and the data pad terminal, the third photoresist pattern corresponding to the pixel electrode and the common electrode, the fourth photoresist pattern corresponding to the gate pad terminal;
- patterning the conductive layer using the first, second, third and fourth photoresist patterns as an etching mask to thereby form the source and drain electrodes, the data cover line, the data pad terminal, the pixel electrode, the common electrode and the gate pad terminal;
- removing the ohmic contact layer between the source and drain electrodes to thereby expose the active layer between the source and drain electrodes;
- forming an insulating layer on the substrate including the first, second, third and fourth photoresist patterns; and
- selectively removing the insulating layer with the first, second, third and fourth photoresist patterns.

12. The method according to claim 11, wherein the patterning the conductive layer includes over-etching the conductive layer using wet-etching to thereby expose lower surfaces at peripheries of the first, second, third and fourth photoresist patterns so that each lower surface has a width within a range of 2,000 to 5,000 Å.

13. The method according to claim 11, wherein forming the passivation layer includes disposing a shadow mask over the substrate such that the shadow mask covers the gate pad terminal and the data pad terminal and depositing an insulating material on the substrate excluding the gate pad terminal and the data pad terminal.

14. The method according to claim 4, wherein the forming a gate insulating layer, an active layer, an ohmic contact layer and a data line sequentially disposed on the substrate including the gate electrode and the gate line through a second mask process further includes forming a buffer metallic layer on the ohmic contact layer.

15. The method according to claim 14, wherein forming the buffer metallic layer includes sequentially depositing and then patterning molybdenum-titanium (MoTi) alloy, copper and MoTi alloy.

* * * * *